US012604499B2

(12) United States Patent
Chang et al.

(10) Patent No.: US 12,604,499 B2
(45) Date of Patent: Apr. 14, 2026

(54) SEMICONDUCTOR DEVICES WITH EMBEDDED FERROELECTRIC FIELD EFFECT TRANSISTORS

(71) Applicant: Taiwan Semiconductor Manufacturing Co., Ltd., Hsin-Chu (TW)

(72) Inventors: Chia-Hao Chang, Hsinchu City (TW); Lin-Yu Huang, Hsinchu (TW); Han-Jong Chia, Hsinchu City (TW); Bo-Feng Young, Taipei (TW); Yu-Ming Lin, Hsinchu City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 225 days.

(21) Appl. No.: 18/359,323

(22) Filed: Jul. 26, 2023

(65) Prior Publication Data

US 2024/0021726 A1     Jan. 18, 2024

Related U.S. Application Data

(60) Continuation of application No. 17/811,212, filed on Jul. 7, 2022, now Pat. No. 11,799,030, which is a division of application No. 16/939,909, filed on Jul. 27, 2020, now Pat. No. 11,404,570.

(60) Provisional application No. 62/982,375, filed on Feb. 27, 2020.

(51) Int. Cl.
H10D 64/00        (2025.01)
H10D 30/69        (2025.01)

H10D 64/01        (2025.01)
H10D 64/68        (2025.01)

(52) U.S. Cl.
CPC ......... H10D 30/701 (2025.01); H10D 64/033 (2025.01); H10D 64/689 (2025.01)

(58) Field of Classification Search
CPC .. H10D 30/701; H10D 64/033; H10D 64/689; H10D 84/834; H10B 53/30; H10B 51/03
USPC ........................................................ 257/295
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,836,016 B2 | 9/2014 | Wu et al. | |
| 8,841,701 B2 | 9/2014 | Lin et al. | |

(Continued)

FOREIGN PATENT DOCUMENTS

| | | |
|---|---|---|
| CN | 106505104 A | 3/2017 |
| TW | 201725615 A | 7/2017 |

*Primary Examiner* — Sheikh Maruf
(74) *Attorney, Agent, or Firm* — HAYNES AND BOONE, LLP

(57)                ABSTRACT

A device includes a substrate, gate stacks, source/drain (S/D) features over the substrate, S/D contacts over the S/D features, and one or more dielectric layers over the gate stacks and the S/D contacts. A via structure penetrates the one or more dielectric layers and electrically contacts one of the gate stacks and the S/D contacts. And a ferroelectric (FE) stack is over the via structure and directly contacting the via structure, wherein the FE stack includes an FE feature and a top electrode over the FE feature.

20 Claims, 23 Drawing Sheets

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,962,400 B2 | 2/2015 | Tsai et al. | |
| 9,093,514 B2 | 7/2015 | Tsai et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,257,439 B2 | 2/2016 | Liaw | |
| 9,520,394 B1 * | 12/2016 | Basker | H01L 21/02381 |
| 9,520,482 B1 | 12/2016 | Chang et al. | |
| 9,576,814 B2 | 2/2017 | Wu et al. | |
| 9,633,999 B1 * | 4/2017 | Lu | H10D 84/83 |
| 9,978,772 B1 | 5/2018 | Carlson | |
| 10,319,581 B1 | 6/2019 | Wen et al. | |
| 10,483,378 B2 | 11/2019 | Ching et al. | |
| 10,490,552 B2 | 11/2019 | Lee et al. | |
| 11,152,475 B2 | 10/2021 | Huang et al. | |
| 2013/0026571 A1 | 1/2013 | Kawa et al. | |
| 2013/0175583 A1 * | 7/2013 | Yuan | H01L 23/485 |
| | | | 257/E21.585 |
| 2014/0084340 A1 | 3/2014 | Wang et al. | |
| 2014/0175531 A1 | 6/2014 | Huang et al. | |
| 2014/0203372 A1 * | 7/2014 | Yeh | H10D 84/017 |
| | | | 257/369 |
| 2014/0252412 A1 | 9/2014 | Tsai et al. | |
| 2015/0311217 A1 | 10/2015 | Chavan et al. | |
| 2016/0049516 A1 | 2/2016 | Huang et al. | |
| 2016/0064391 A1 | 3/2016 | Li et al. | |
| 2016/0104793 A1 | 4/2016 | Ching | |
| 2016/0155748 A1 | 6/2016 | Li et al. | |
| 2016/0163859 A1 * | 6/2016 | Wu | H01L 21/02167 |
| | | | 438/285 |
| 2016/0225860 A1 | 8/2016 | Karda et al. | |
| 2016/0233298 A1 | 8/2016 | Webb et al. | |
| 2016/0260714 A1 * | 9/2016 | Flachowsky | H10D 84/834 |
| 2016/0268434 A1 | 9/2016 | Ching et al. | |
| 2016/0336319 A1 | 11/2016 | Yang et al. | |
| 2017/0012042 A1 | 1/2017 | Cai et al. | |
| 2017/0178960 A1 | 6/2017 | Basker et al. | |
| 2017/0207126 A1 | 7/2017 | Ching et al. | |
| 2018/0068900 A1 * | 3/2018 | Chang | H10D 30/62 |
| 2018/0151745 A1 * | 5/2018 | Chang | H10D 1/68 |
| 2019/0006486 A1 | 1/2019 | Ching et al. | |
| 2019/0019551 A1 * | 1/2019 | Lee | H10N 70/24 |
| 2019/0067488 A1 * | 2/2019 | Tsai | H10D 84/834 |
| 2019/0097061 A1 * | 3/2019 | Ho | H10D 64/021 |
| 2019/0131458 A1 | 5/2019 | Yoo | |
| 2019/0198638 A1 | 6/2019 | Van Houdt et al. | |
| 2019/0393341 A1 * | 12/2019 | Mochizuki | H10D 30/025 |
| 2020/0118887 A1 * | 4/2020 | Shen | H01L 21/30625 |
| 2020/0243687 A1 * | 7/2020 | Ota | H01L 23/53266 |
| 2020/0312978 A1 * | 10/2020 | Kavalieros | H10D 30/62 |
| 2021/0217696 A1 * | 7/2021 | Anderson | H01L 23/53214 |
| 2022/0020747 A1 * | 1/2022 | Liao | H10D 64/689 |
| 2022/0344357 A1 * | 10/2022 | Chung | H10D 64/033 |
| 2022/0384458 A1 * | 12/2022 | Chen | H10D 64/033 |
| 2022/0384483 A1 * | 12/2022 | Lu | H10D 30/0415 |
| 2022/0393016 A1 * | 12/2022 | Choe | H10D 30/6735 |

* cited by examiner

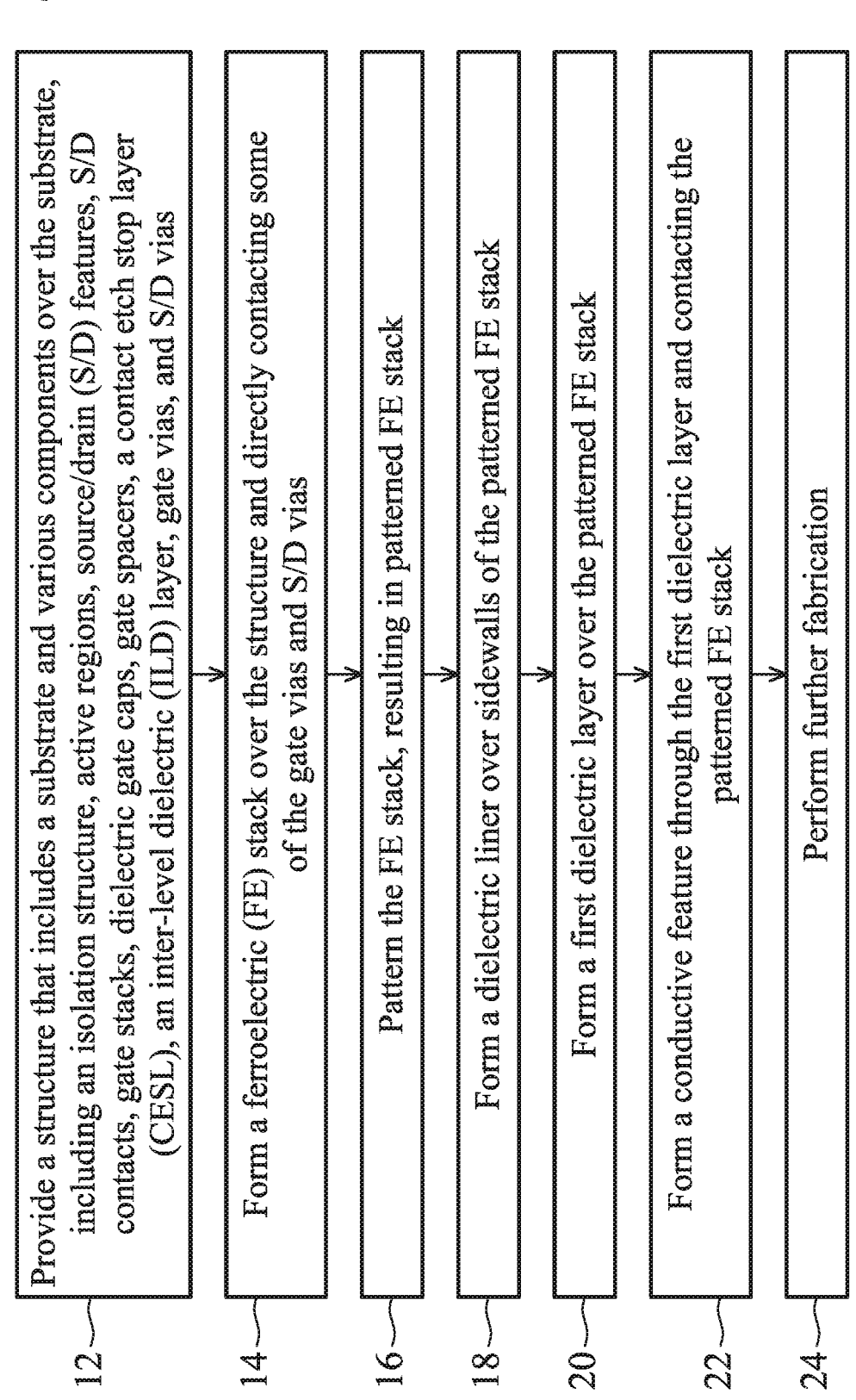

10

12 — Provide a structure that includes a substrate and various components over the substrate, including an isolation structure, active regions, source/drain (S/D) features, S/D contacts, gate stacks, dielectric gate caps, gate spacers, a contact etch stop layer (CESL), an inter-level dielectric (ILD) layer, gate vias, and S/D vias 14 — Form a ferroelectric (FE) stack over the structure and directly contacting some of the gate vias and S/D vias 16 — Pattern the FE stack, resulting in patterned FE stack 18 — Form a dielectric liner over sidewalls of the patterned FE stack 20 — Form a first dielectric layer over the patterned FE stack 22 — Form a conductive feature through the first dielectric layer and contacting the patterned FE stack 24 — Perform further fabrication

FIG. 1

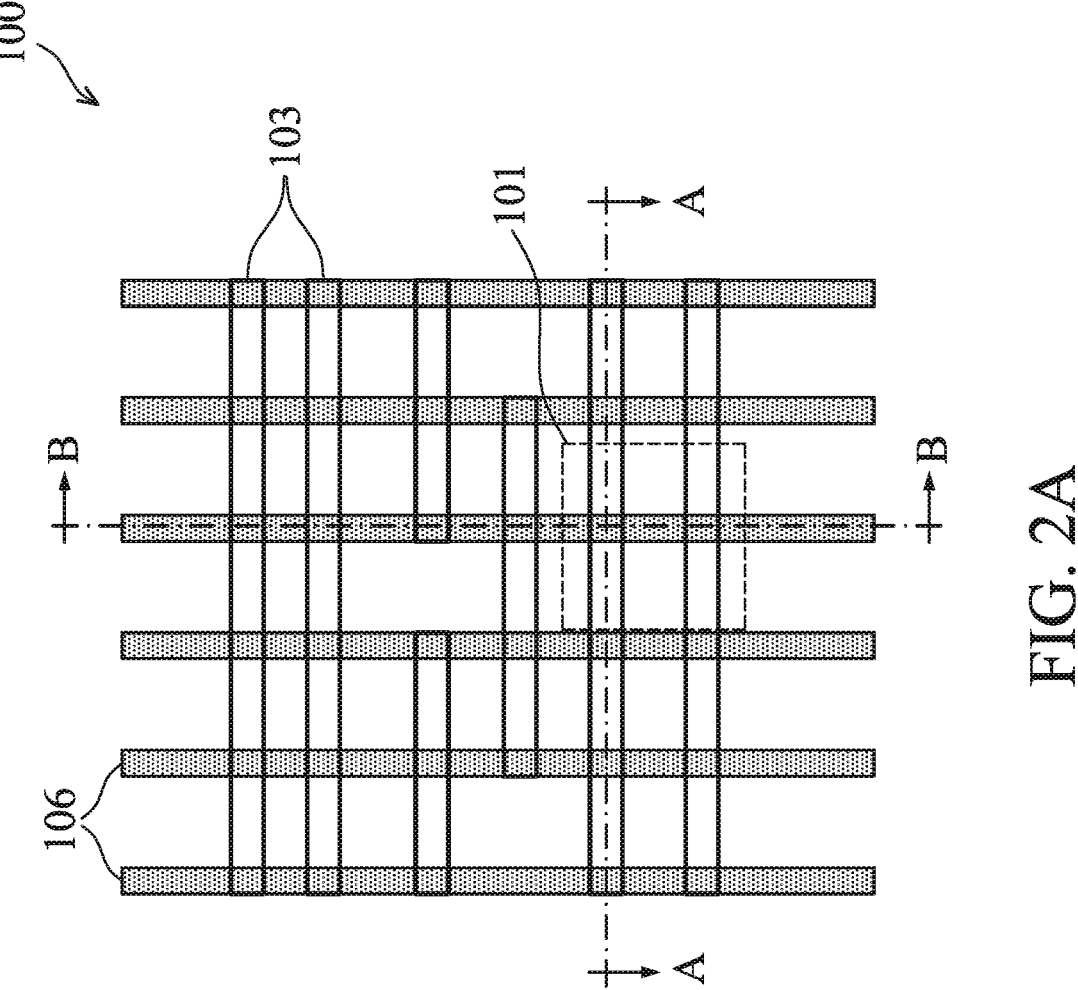
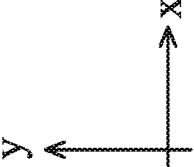
FIG. 2A

SEMICONDUCTOR DEVICES WITH EMBEDDED FERROELECTRIC FIELD EFFECT TRANSISTORS

PRIORITY

This is a continuation application of U.S. application Ser. No. 17/811,212, filed Jul. 7, 2022, which is a divisional application of U.S. application Ser. No. 16/939,909, filed Jul. 27, 2020, which claims the benefits of and priority to U.S. Provisional Application Ser. No. 62/982,375, filed Feb. 27, 2020, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvements. One area of improvements is how to more efficiently integrate ferroelectric field effect transistors (FeFET or FE) with CMOS devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 show a flow chart of a method of forming a semiconductor device with ferroelectric FETs integrated with MOSFET devices, according to various aspects of the present disclosure.

FIG. 2A illustrates a top view of a portion of a semiconductor device in an intermediate step of fabrication according to an embodiment of the method of FIG. 1.

DETAILED DESCRIPTION

Figure 2B:
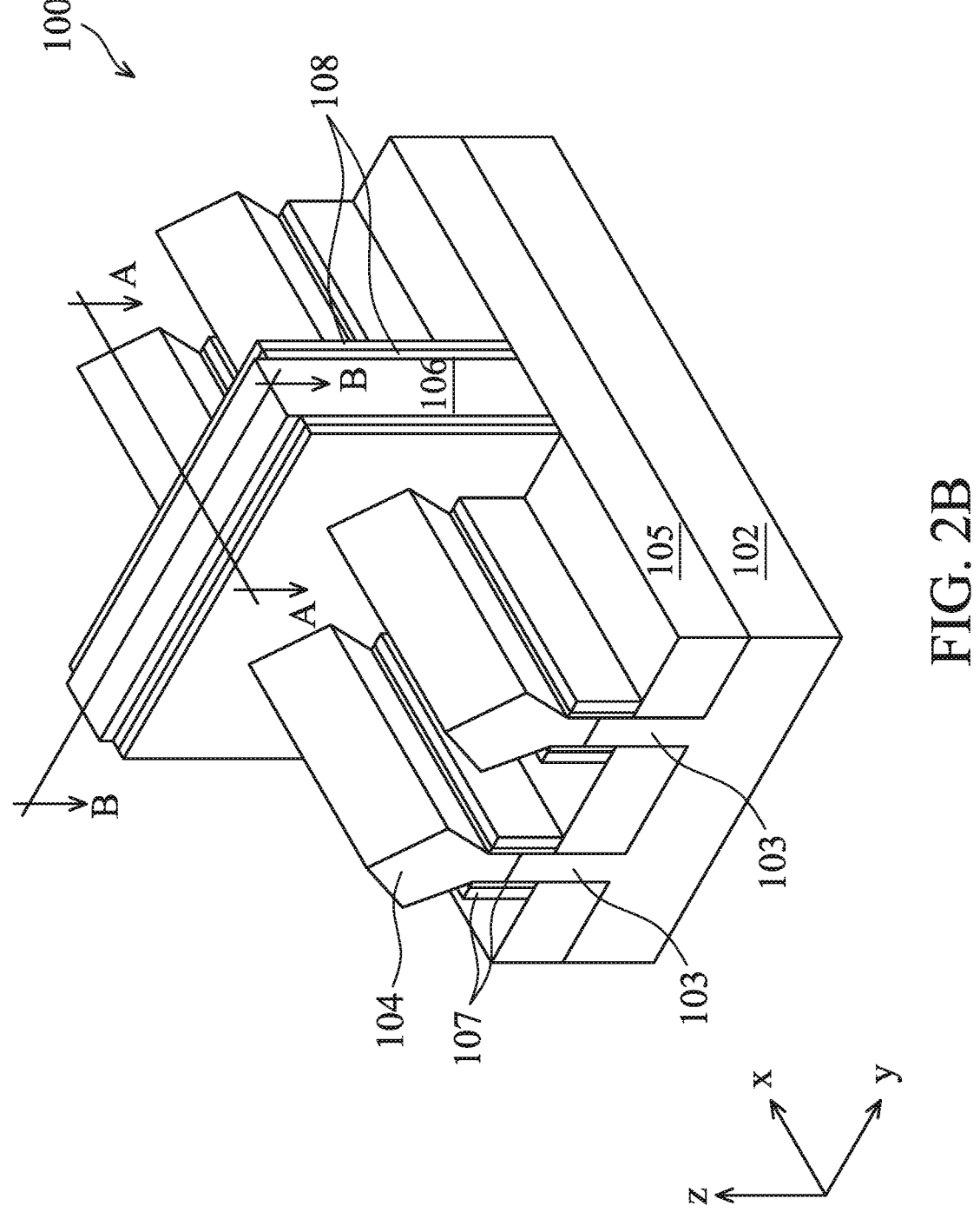
FIG. 2B illustrates a perspective view of a portion 101 of the semiconductor device in FIG. 2A according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure relates to a semiconductor fabrication process and the structure thereof, and more particularly to a process of forming a semiconductor device having both MOSFETs and ferroelectric FETs (FeFETs). FeFETs can be integrated with MOSFETs (such as CMOSFETs, FinFETs, nanowire FETs, nanosheet FETs, or other types of multi-gate FETs) for increasing an IC's functionality. For example, FeFETs can be used as single transistor non-volatile memory. Some approaches integrate FeFETs in the back-end-of-line (BEOL) processes of MOSFETs. In those approaches, FeFETs do not have direct contact with gate vias and source/drain (S/D) contact vias of MOSFETs. Rather, they are formed in a high-level metal interconnect layer and are connected to gate vias and S/D contact vias through one or more levels of metal lines and vias. The routing is sometimes long and complicated in those approaches. Also, those FeFETs generally have a large footprint because they are formed in upper level interconnect layer(s). Another drawback for integrating FeFETs in BEOL processes is limited thermal budget. Ferroelectric materials generally need to be annealed, for example, at a temperature higher than 400° C. The thermal budget limits what type of metals can be used in the interconnect layers below the FeFETs. For example, copper, a commonly used material for metal lines and vias in interconnect layers, might be adversely affected when integrating FeFETs in BEOL. In contrast, embodiments of the present disclosure integrate the FeFETs with MOSFETs in the middle-end-of-line (MEOL) processes where FeFETs have direct contact with gate vias and S/D contact vias of MOSFETs. The gate vias and S/D contact vias do not have copper or other low-melting-point metals, thus thermal budget for FeFET can be relaxed. Also, since the FeFETs are made in the MEOL, their footprint can be small and the routing between FeFETs and MOSFETs can be shorter and simplified. These and other aspects of the present disclosure are further described by referring to the accompanied figures.

FIG. 1 is a flow chart of a method 10 for fabricating a semiconductor device according to various aspects of the present disclosure. The method 10 is briefly described below. At operation 12, the method 10 provides or is provided with a structure that has gone through a front-end-of-line (FEOL) process for CMOS. For example, the structure may include a substrate, active regions (such as fins) in or on the substrate, an isolation structure over the substrate and between the active regions, gate stacks over the isolation structure and engaging the active regions to form transistors such as MOSFETs (including planar MOSFETs, FinFETs, nanowire FETs, nanosheet FETs, or other types of multi-gate FETs). The structure further includes S/D features on both sides of each gate stack, S/D contacts to the S/D features, one or more dielectric layers over the gate stacks and S/D contacts, and gate vias and S/D contact vias electrically connecting to the gate stacks and S/D contacts through the one or more dielectric layers. At operation 14, the method 10 deposits a FE stack over the structure. The FE stack includes a layer of ferroelectric material, and an electrode (top electrode) over the layer of ferroelectric material. The FE stack may optionally include another electrode (bottom electrode) under the layer of ferroelectric material. Particularly, the FE stack directly contacts the gate vias and the S/D contact vias. At operation 16, the method 10 patterns the FE stack to form various patterned FE stacks (or FeFETs), per design requirements. At operation 18, the method 10 forms a dielectric liner around the sidewalls of the FeFETs. At operation 20, the method 10 forms a dielectric layer covering the FeFETs. At operation 22, the method 10 forms conductive features (e.g., metal lines and vias) in the dielectric layer and electrically connecting to the FeFETs. At operation 24, the method 10 performs further steps to complete the fabrication. Additional processing is contemplated by the present disclosure. Additional operations can be provided before, during, and after method 10, and some of the operations described can be moved, replaced, or eliminated for additional embodiments of method 10.

Method 10 is further described below in conjunction with FIGS. 2A-20 that illustrate various top, perspective, and cross-sectional views of a semiconductor device 100 at various steps of fabrication according to the method 10, in accordance with some embodiments. In some embodiments, the device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device 100 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-21 have been simplified for the sake of clarity to better understand the inventive concepts of the present disclosure. Additional features can be added in the device 100, and some of the features described below can be replaced, modified, or eliminated in other embodiments of the device 100.

Figures 2C, 2D:
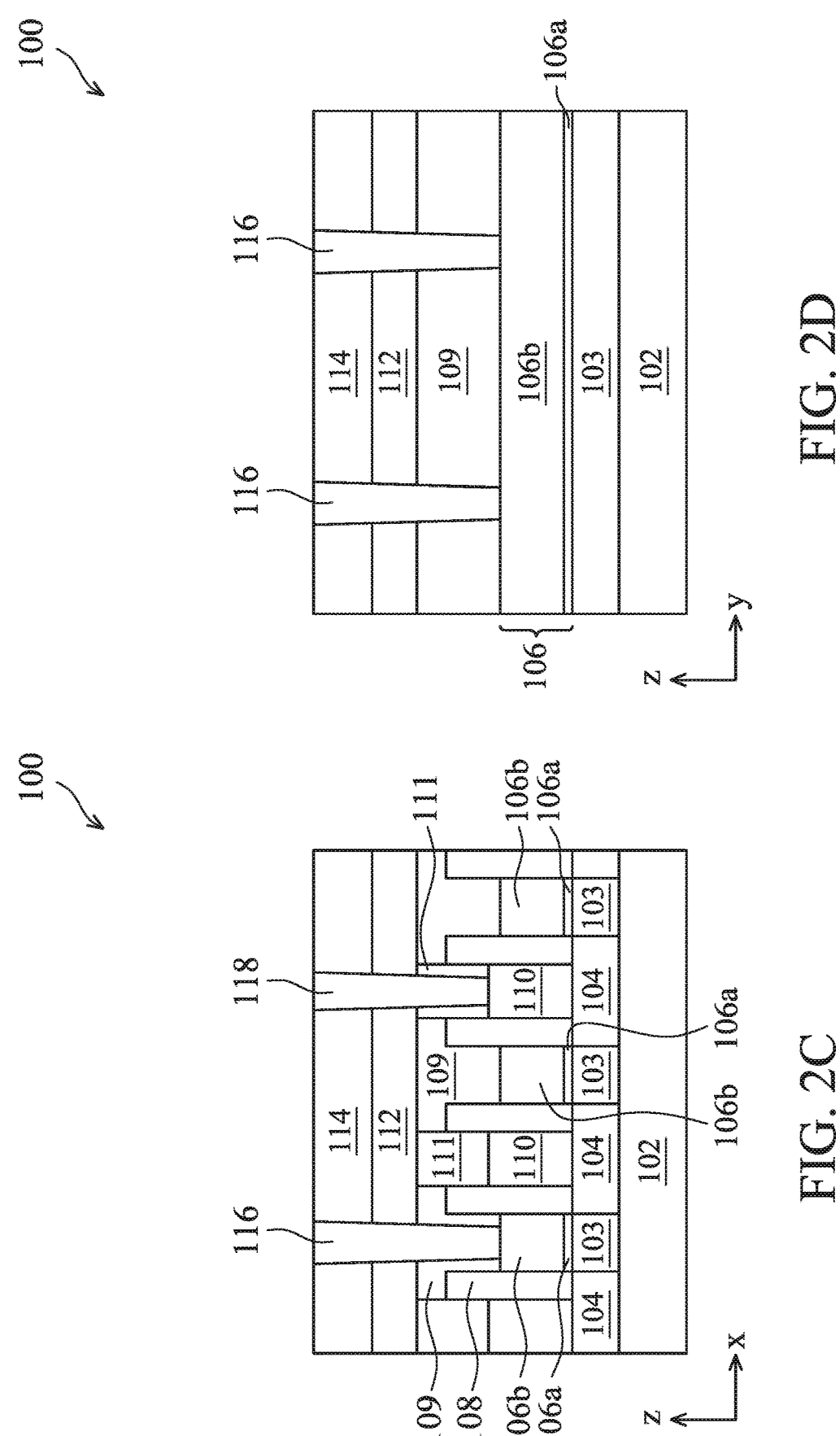
FIGS. 2C, 3A, 4A, 5A, 6A, 7A, 8A, 9A, 10A, 11A, 12A, 13A, 14A, 15A, 16A, 17A, 18A, 19, and 20 illustrate a cross-sectional view of a portion of a semiconductor device along the A-A line in FIGS. 2A and 2B, according to some embodiments.
FIGS. 2D, 3B, 4B, 5B, 6B, 7B, 8B, 9B, 10B, 11B, 12B, 13B, 14B, 15B, 16B, 17B, and 18B illustrates a cross-sectional view of a portion of a semiconductor device along the B-B line in FIGS. 2A and 2B, according to some embodiments.

At operation 12, the method 10 (FIG. 1A) provides a structure of the device 100, an embodiment of which is illustrated in FIGS. 2A, 2B, 2C, and 2D. Particularly, FIGS. 2A and 2B illustrate a top view and a perspective view, respectively, of a portion of the device 100 according to an embodiment; FIG. 2C illustrates a cross-sectional view of a portion of the device 100 along the A-A line in FIGS. 2A and 2B, according to an embodiment; and FIG. 2D illustrates a cross-sectional view of a portion of the device 100 along the B—B line in FIGS. 2A and 2B, according to an embodiment.

Referring to FIG. 2A, the device 100 includes active regions 103 oriented lengthwise along an "x" direction and gate stacks (or gate structures) 106 oriented lengthwise along a "y" direction that is generally perpendicular to the "x" direction. In the present embodiment, the active regions 103 are semiconductor fins. Hereinafter the active regions 103 are also referred to as semiconductor fins 103 or fins 103. The active regions 103 may be of other shapes or configurations in other embodiments.

Referring to FIGS. 2A-2D collectively, the device 100 includes a substrate 102, over which the fins 103 and the gate stacks 106 are formed. The device 100 includes an isolation structure 105 for isolating the fins 103. The fins 103 extend from the substrate 102 and above the isolation structure 105. The gate stacks 106 are disposed above the isolation structure 105 and on three sides of every fin 103. The device 100 further includes gate spacers 108 on sidewalls of the gate stacks 106 and optional fin sidewall spacers 107 on some sidewalls of the fins 103. The device 100 further includes S/D features 104 on top of the fins 103 and on both sides of the gate stacks 106. The device 100 further includes a dielectric cap 109 on top of the gate stacks 106, S/D contacts 110 on top of the S/D features 104, another dielectric cap 111 on top of the S/D contacts 110, and dielectric layers 112 and 114 over the dielectric caps 109 and 111. The device 100 further includes gate vias 116 through one or more of the dielectric layers and electrically connecting to the gate stacks 106, and S/D contact vias 118 (one shown) through one or more of the dielectric layers and electrically connecting to the S/D contacts 110. The various features (or components) of the device 100 are further described below.

The substrate 102 is a silicon (Si) substrate in the present embodiment, such as a silicon wafer. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 103 may include one or more layers of semiconductor materials such as silicon or silicon germanium. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable. In some embodiment where the device 100 includes gate-all-around transistors such as nanosheet devices or nanowire devices, the fins 103 include multiple layers of semiconductor materials (such as silicon) that are vertically stacked (along the "z" direction) and portions of the gate stacks 106 wrap around each of the multiple layers of semiconductor materials in the channel regions of the transistors.

The S/D features 104 include epitaxially grown semiconductor materials such as epitaxially grown silicon, germanium, or silicon germanium. The S/D features 104 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 104 may be doped with n-type dopants and/or p-type dopants. In some embodiments, for n-type transistors, the S/D features 104 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 104 include silicon germanium or germanium, and can be doped with boron, other p-type dopant, or combinations thereof (for example, forming Si:Ge:B epitaxial S/D features). The S/D features 104 may include multiple epitaxial semiconductor layers having different levels of dopant density. In some embodiments, annealing processes (e.g., rapid thermal annealing (RTA) and/or laser annealing) are performed to activate dopants in the epitaxial S/D features 104.

The isolation structure 105 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers (e.g., silicon nitride) on surfaces of the substrate 102 and the fins 103 and a main isolating layer (e.g., silicon dioxide) over the one or more liner layers.

In an embodiment, each gate stack 106 includes a gate dielectric layer 106a and a gate electrode layer 106b over the gate dielectric layer 106a. The gate dielectric layer 106a may include a high-k dielectric material such as hafnium oxide, zirconium oxide, lanthanum oxide, titanium oxide, yttrium oxide, and strontium titanate. The gate dielectric layer 106a may be formed by chemical oxidation, thermal oxidation, atomic layer deposition (ALD), chemical vapor deposition (CVD), and/or other suitable methods. In some embodiments, the gate stack 106 further includes an interfacial layer between the gate dielectric layer 106a and the fin 103. The interfacial layer may include silicon dioxide, silicon oxynitride, or other suitable materials. In some embodiments, the gate electrode layer 106b includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 106b may be formed by CVD, PVD, plating, and/or other suitable processes. In the embodiments depicted in FIGS. 2C and 2D, the gate vias 116 electrically contact the gate electrode layer 106b of the gate stacks 106.

Each of the fin sidewall spacers 107 and the gate spacers 108 may be a single layer or multi-layer structure. In some embodiments, each of the spacers 107 and 108 include a dielectric material, such as silicon oxide ($SiO_2$), silicon nitride ($Si_3N_4$), silicon oxynitride (SiON), other dielectric material, or combination thereof. In an example, the spacers 107 and 108 are formed by depositing a first dielectric layer (e.g., a $SiO_2$ layer having a substantially uniform thickness) as an liner layer over the device 100 including the gate stacks 106 and the fins 103, and a second dielectric layer (e.g., a $Si_3N_4$ layer) as a main D-shaped spacer over the first dielectric layer, and then, anisotropically etching to remove portions of the dielectric layers to form the spacers 107 and 108. Additionally, the fin sidewall spacers 107 may be partially removed during the etching process that forms recesses into the fins 103 prior to growing the S/D features 104. In some embodiments, the fin sidewall spacers 107 may be completely removed by such etching process.

The S/D contacts 110 may include one or more metallic materials such as tungsten (W), cobalt (Co), ruthenium (Ru), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In some embodiments, the S/D contacts 110 include a layer of metal nitride (e.g., TiN, TiAlN, WN, or TaN) and a layer of metal (e.g., W, Co, or Ru) over the layer of the metal nitride. To further these embodiments, the layer of metal nitride makes direct contact with the surfaces of the gate spacers 108 and the S/D features 104. In some embodiments, the device 100 includes a silicide feature between the S/D features 104 and the S/D contacts 110.

Each of the dielectric caps 109 and 111 may include a dielectric material such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric caps 109 and 111 may be formed by atomic layer deposition (ALD), CVD, and/or other suitable methods and may contain the same or different dielectric materials. The dielectric cap 109 may be formed by recessing the gate stacks 106, depositing one or more dielectric materials over the recessed gate stacks 106, and performing a CMP process to the one or more dielectric materials. The dielectric cap 111 may be formed by recessing the S/D contacts 110, depositing one or more dielectric materials over the recessed S/D contacts 110, and performing a CMP process to the one or more dielectric materials.

The dielectric layer 112 may comprise silicon nitride, silicon oxynitride, silicon nitride with oxygen (O) or carbon (C) elements, and/or other materials; and may be formed by CVD, PVD, ALD, or other suitable methods. In an embodiment, the dielectric layer 112 is deposited to a substantially uniform thickness over the surfaces of the dielectric caps 109 and 111. In the present embodiment, the dielectric layer 112 is a contact etch stop layer (CESL). Thus, it is also referred to as CESL 112.

The dielectric layer 114 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer 114 may be formed by PECVD (plasma enhanced CVD), FCVD (flowable CVD), or other suitable methods. The dielectric layer 114 is an inter-level dielectric (ILD) layer in the present embodiment. Thus, it is also referred to as ILD 114.

The gate vias 116 may include one or more conductive materials such as Co, W, Ru, Al, Mo, Ti, TiN, TiSi, CoSi, NiSi, TaN, Ni, TiSiN, or combinations thereof, and may be formed by CVD, PVD, plating, and/or other suitable processes. The gate vias 116 penetrate through the various dielectric layers atop the gate stacks 106 and make electrical contact with the gate stacks 106. In the present embodiment, the gate vias 116 penetrate through the dielectric layers 114, 112, and 109. In some embodiments, the device 100 further includes a gate via glue layer (or adhesion layer) 150 between the gate vias 116 and the various dielectric layer (see FIG. 9A for an example).

The S/D contact vias 118 may include one or more conductive materials such as Co, W, Ru, Al, Mo, Ti, TiN, TiSi, CoSi, NiSi, TaN, Ni, TiSiN, or combinations thereof, and may be formed by CVD, PVD, plating, and/or other suitable processes. The S/D contact vias 118 penetrate through the various dielectric layers atop the S/D contacts 110 and make electrical contact with the S/D contact s 110. In the present embodiment, the S/D contact vias 118 penetrate through the dielectric layers 114, 112, and 111. In some embodiments, the device 100 further includes an S/D contact via glue layer (or adhesion layer) 152 between the S/D contact vias 118 and the various dielectric layer (see FIG. 9A for an example).

The gate vias 116 and the S/D contact vias 118 may be formed by a process that includes photolithography, etching, deposition, and CMP. For example, a photolithography process may be used to create an etch mask providing openings over the device 100. The openings correspond to where the gate vias 116 and the S/D contact vias 118 are located. Then, the various dielectric layers 114, 112, 111, and 109 are etched through the openings to form trenches that expose surfaces of the gate stacks 106 and/or the S/D contacts 110. Subsequently, one or more conductive martials are deposited into the trenches and a CMP process is performed to remove excessive portions of the one or more conductive martials and planarize the top surface of the device 100. The remaining portions of the one or more conductive martials become the gate vias 116 and/or the S/D contact vias 118. In various embodiments, the gate vias 116 and the S/D contact vias 118 may include the same or different materials and may be formed by the same or different processes.

Figures 3A, 3B:
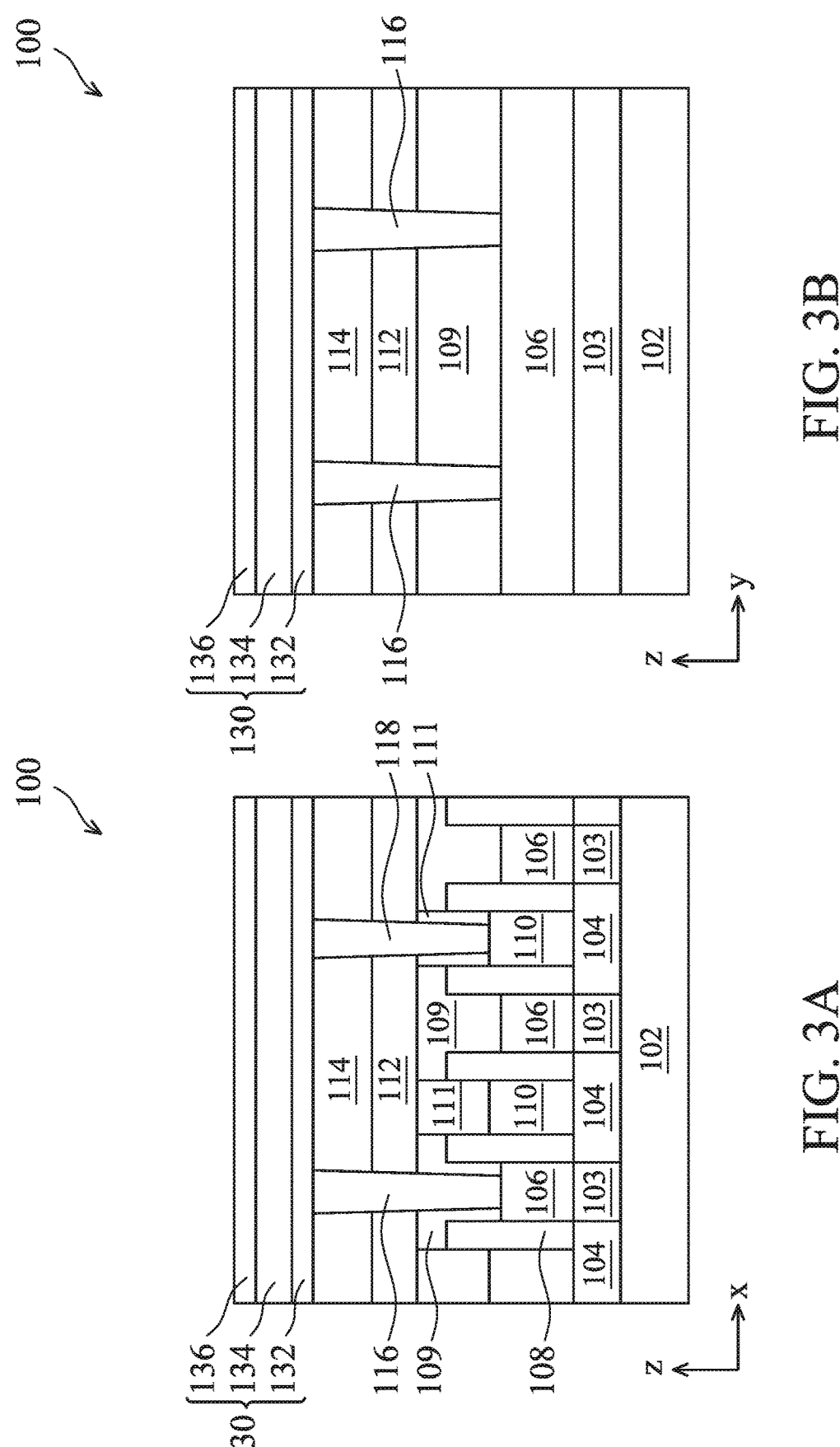

At operation 14, the method 10 (FIG. 1A) forms a ferroelectric (FE) stack 130 over the gate vias 116 and the S/D contact vias 118. Referring to FIGS. 3A and 3B, in the present embodiment, the FE stack 130 includes a bottom electrode layer 132, an FE layer 134 over the bottom electrode layer 132, and a top electrode layer 136 over the FE layer 134. The bottom electrode layer 132 directly contacts the gate vias 116 and the S/D contact vias 118. The bottom electrode layer 132 may include a conductive material such as Ru, Pt, Ta, TaN, Ti, $TiO_2$, TiN, W, Ir, $IrO_2$, $SrRuO_3$, $LaNiO_3$, or a combination thereof. The bottom electrode layer 132 may have a thickness (along the "z" direction) of about 0.5 nm to about 30 nm in some embodiments. The FE layer 134 may include PZT ($Pb(ZrxTi_{1-x})O_3$), SBT ($SrBi_2Ta_2O_9$), BLT (($Bi,La)_4Ti_3O_{12}$), BIT ($Bi_4Ti_3O_{12}$), $HfZrO_2$, $HfO_2$, BFO ($BiFeO_3$), or other suitable ferroelectric material(s). The FE layer 134 may have a thickness (along the "z" direction) of about 0.5 nm to about 50 nm in some embodiments. The top electrode layer 136 may include a conductive material such as Ru, Pt, Ta, TaN, Ti, $TiO_2$, TiN, W, Ir, $IrO_2$, $SrRuO_3$, $LaNiO_3$, or a combination thereof. The top electrode layer 136 may have a thickness (along the "z" direction) of about 0.5 nm to about 30 nm in some embodiments. The layers 132, 134, and 136 may be formed by ALD, CVD, PVD, plating, and/or other suitable processes. In some embodiments, the bottom electrode layer 132 is omitted in the FE stack 130 (see FIGS. 10A and 10B for an example). In those embodiments, the FE layer 134 directly contacts the gate vias 116 and the S/D contact vias 118. In some embodiments, after the FE layer 134 is deposited, the method 10 anneals the FE layer 134. The annealing temperature depends on the material(s) in the FE layer 134 and is designed to be tolerable by the various structures of the device 100 including the gate vias 116, the S/D contact vias 118, and/or the electrode layers 132 and 136. In some examples, the annealing temperature exceeds 400° C. In the present embodiment, since the gate vias 116, the S/D contact vias 118, and the electrode layers 132 and 136 do not include copper or other low-melting-point metal(s), the annealing temperature can be designed to be high and effective in treating the FE materials.

Figures 4A, 4B:
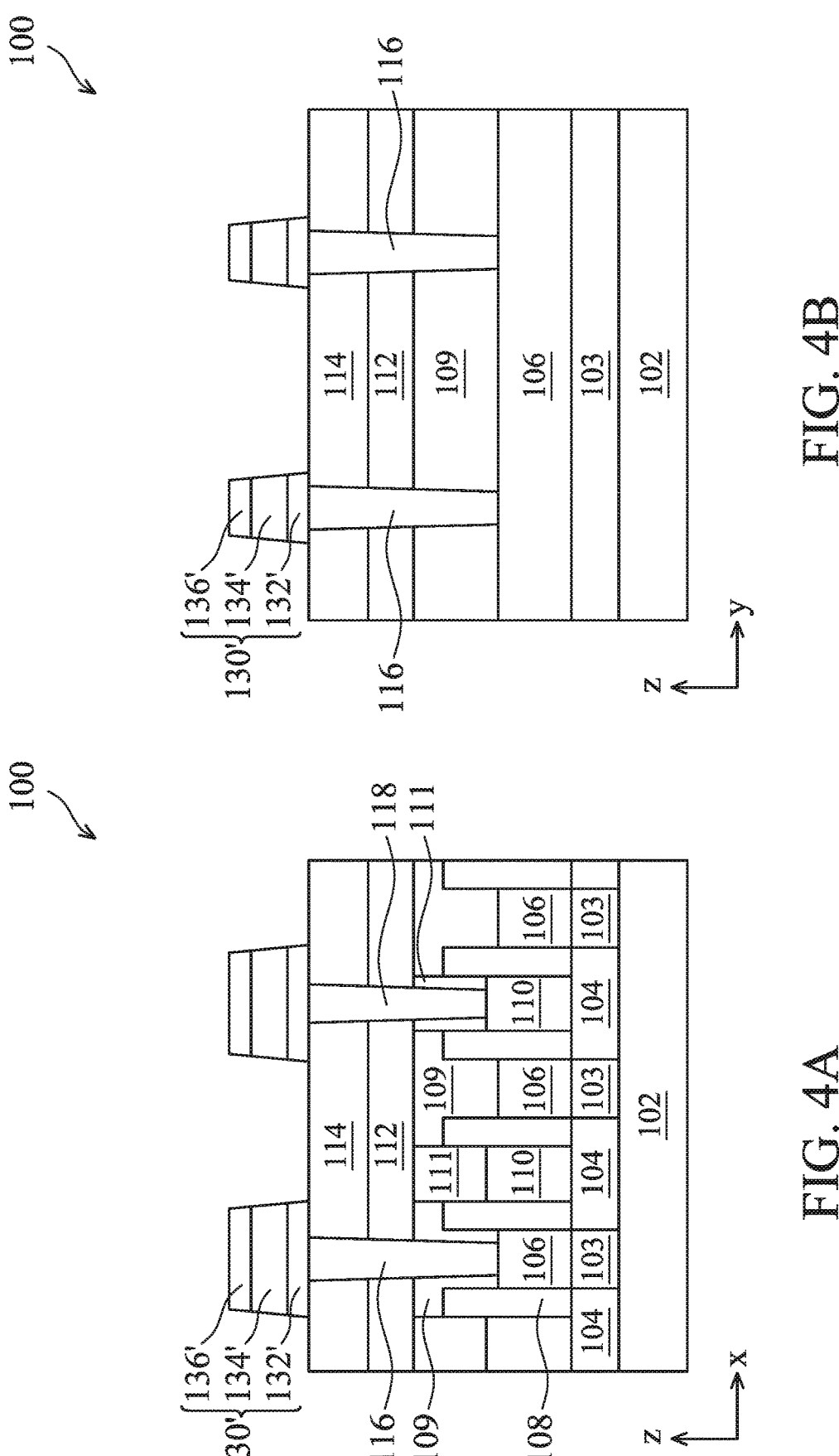

At operation 16, the method 10 (FIG. 1A) patterns the FE stack 130 to results in various patterned FE stacks 130' (FIGS. 4A, 4B). The patterned FE stacks 130' are FeFETs in the present embodiment. Therefore, the patterned FE stacks 130' are also referred to as FeFETs 130'. The operation 16 may include a variety of processes including deposition, photolithography, and etching. For example, the operation 16 may deposit an anti-reflective coating (ARC) layer over the FE stack 130, and a resist layer over the ARC layer, for example, by spin coating. In some embodiments, the ARC layer may be omitted. Subsequently, the operation 16 performs an exposure process to the resist layer, performs a post-exposure baking process, and develops the exposed resist layer in a developer solution. After development, the resist layer is patterned into a resist pattern that provides opening therethrough. Then, the optional ARC layer and the FE stack 130 are etched through the openings using dry etching, wet etching, reactive ion etching, or other suitable etching methods. In an embodiment, the etching process is tuned selective to the materials of the FE stack 130 and has no (or little) etching to the dielectric layer 114 and the vias 116, 118. After the etching is completed, the operation 16 removes the resist pattern and the optional ARC layer from the device 100, for example, using resist stripping, ashing, or other suitable process, which is selective to the resist pattern and the ARC layer. In the embodiment depicted in FIGS. 4A and 4B, each of the FeFETs 130' includes a patterned bottom electrode 132', a patterned FE layer 134' (or FE feature 134'), and a patterned top electrode 136'.

Figures 5A, 5B:
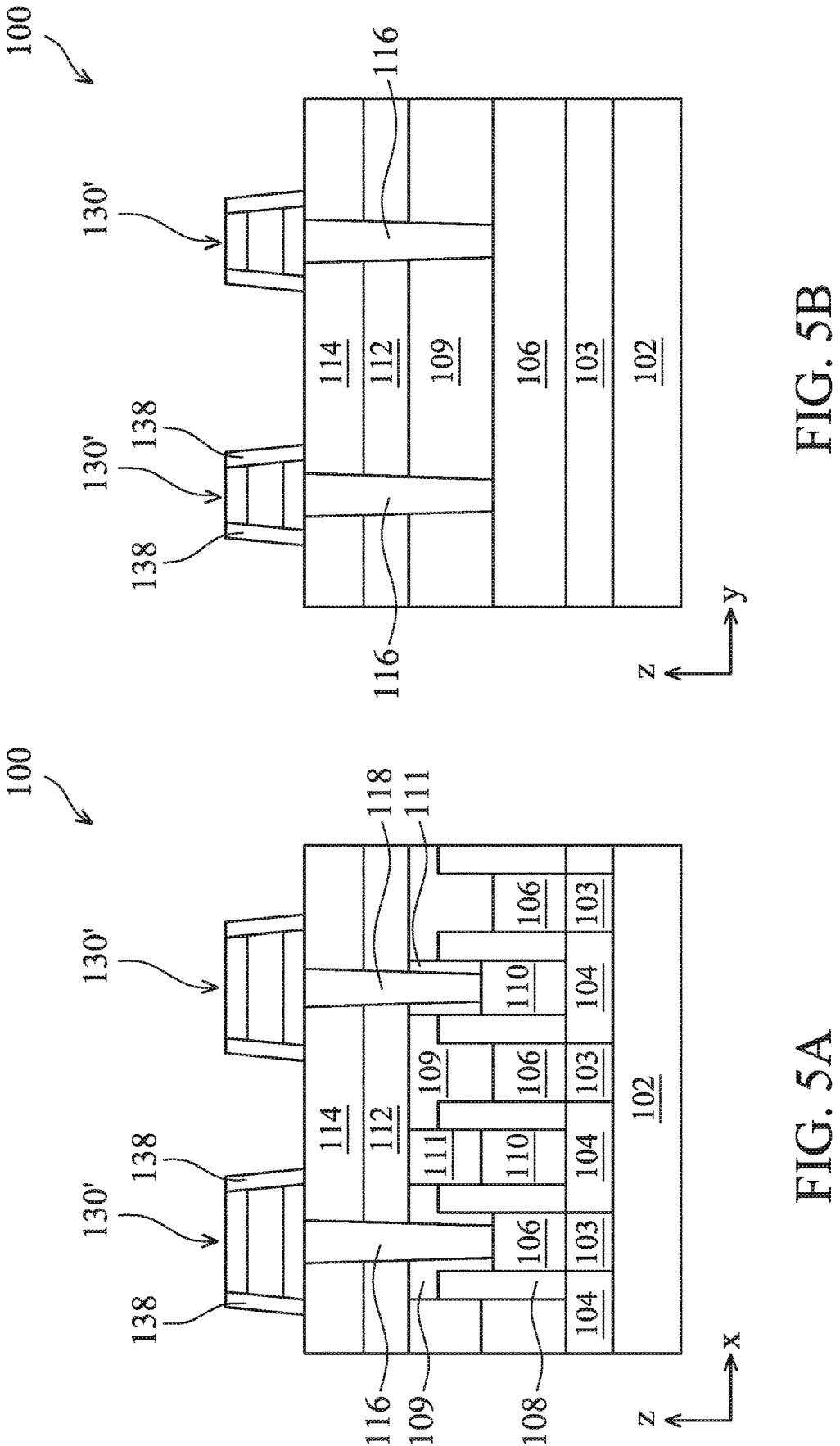

At operation 18, the method 10 (FIG. 1A) forms a dielectric liner 138 on sidewalls of the FeFETs 130', as shown in FIGS. 5A-5B. The dielectric liner 138 may include $La_2O_3$, $Al_2O_3$, SiOCN, SiOC, SiCN, $SiO_2$, SiC, ZnO, ZrN, ZrAlO, $Ta_2O_5$, $ZrO_2$, $HfO_2$, $Si_3N_4$, $Y_2O_3$, AlON, TaCN, SiON, or other suitable materials. In an embodiment, the operation 18 deposits a blanket dielectric layer over the top and sidewall surfaces of the FeFETs 130' and the top surface of the dielectric layer 114, for example, by ALD, CVD, or other suitable methods. Subsequently, the operation 18 removes the portion of the blanket dielectric layer on the top surface of the FeFETs 130' and the top surface of the dielectric layer 114, for example, by an anisotropic etching method, leaving portions of the blanket dielectric layer on the sidewalls of the FeFETs 130' as the dielectric liner 138. The etching can be dry etching, wet etching, or RIE and is tuned selective to the materials of the dielectric liner 138, and with no (or little) etching to the FeFETs 130' and the dielectric layer 114. In the present embodiment, the dielectric liner 138 may have a thickness of about 0.5 nm to about 35 nm (along the "x" and "y" directions).

Figures 6A, 6B:
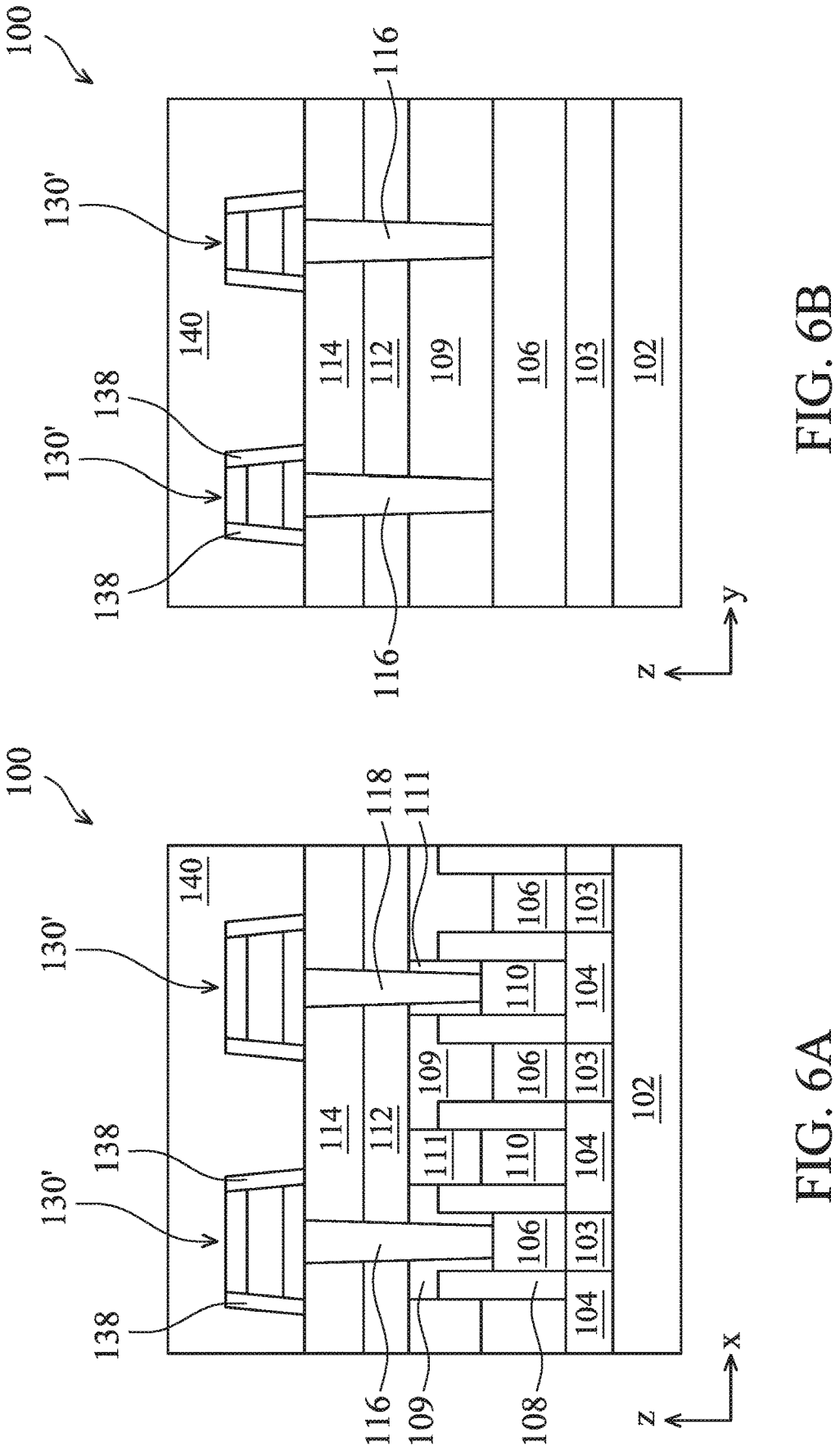

At operation 20, the method 10 (FIG. 1A) forms a dielectric layer 140 over the FeFETs 130' and the dielectric layer 114, such as shown in FIGS. 6A and 6B. Particularly, the FeFETs 130' are embedded in the dielectric layer 140. In the present embodiment, the dielectric layer 140 includes $La_2O_3$, $Al_2O_3$, SiOCN, SiOC, SiCN, $SiO_2$, SiC, ZnO, ZrN, ZrAlO, $Ta_2O_5$, $ZrO_2$, $HfO_2$, $Si_3N_4$, $Y_2O_3$, AlON, TaCN, SiON, or other suitable materials. The dielectric layer 140 may also comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer 140 may be formed by CVD, PECVD (plasma enhanced CVD), FCVD (flowable CVD), or other suitable methods.

Figures 7A, 7B:
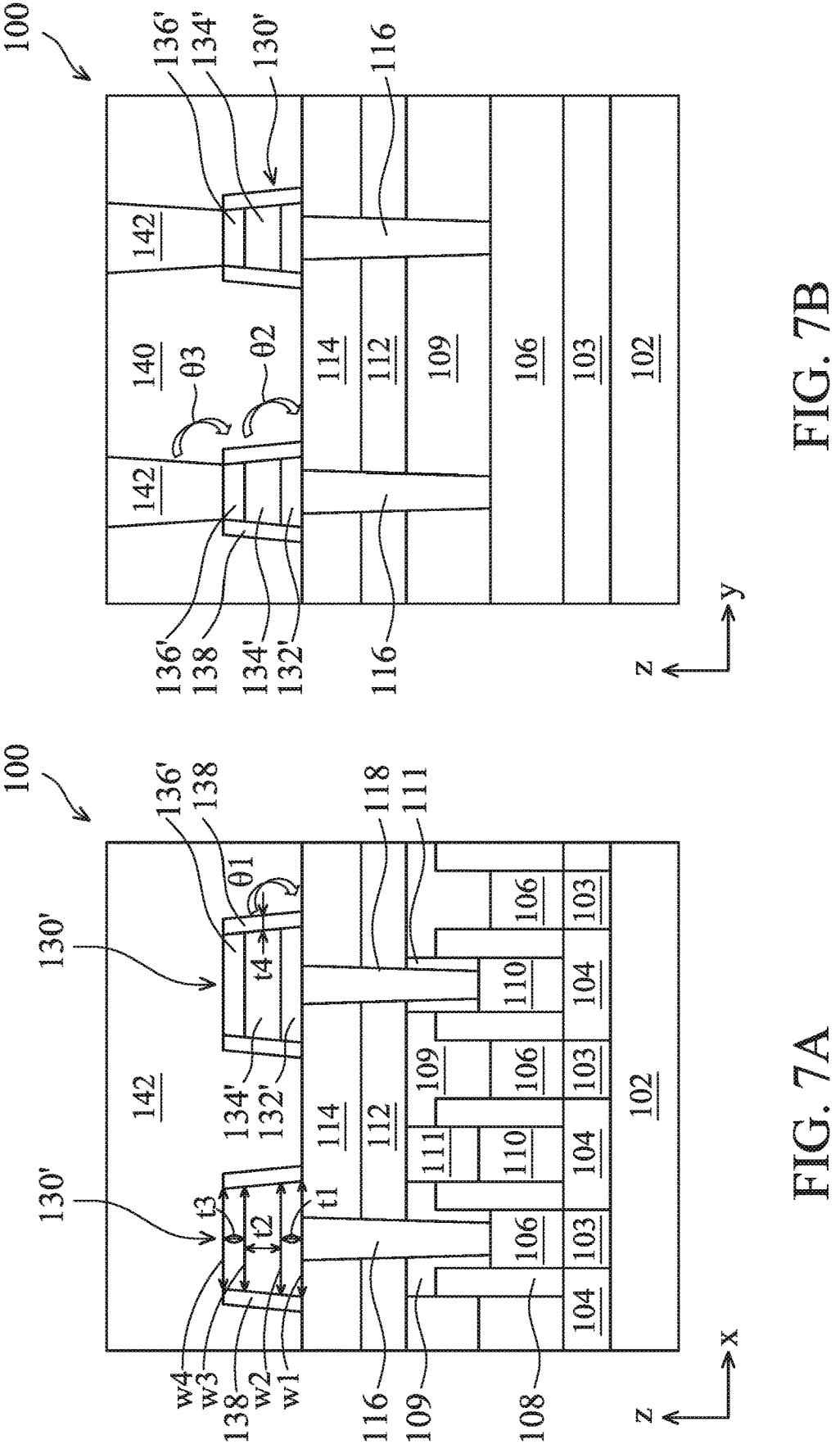

At operation 22, the method 10 (FIG. 1A) forms conductive features 142 in the dielectric layer 140 and electrically connecting to the FeFETs 130', such as shown in FIGS. 7A and 7B. Particularly, the conductive features 142 directly contact the top electrode 136' of the FeFETs 130'. The conductive features 142 may include metal lines and/or metal vias. The conductive features 142 may include copper, aluminum, tungsten, cobalt, ruthenium, a metal nitride (e.g., TiN, TaN, or WN), or other suitable materials. The conductive features 142 may be formed using damascene, dual damascene, or other processes. For example, the operation 22 may perform a photolithography process to form a resist pattern, as discussed earlier. The resist pattern provides openings corresponding to where the conductive features 142 are located. Then, the operation 22 etches the dielectric layer 140 through the openings in the resist pattern to form trenches. The etching is tuned selective to the materials of the dielectric layer 140, and with no (or little) etching to the top electrode 136' and the dielectric liner 138. Subsequently, one or more conductive materials are deposited into the trenches and a CMP process is performed to remove excessive portions of the conductive material(s) and to planarize the top surface of the device 100. The portions of the conductive material(s) remaining in the trenches become the conductive features 142.

FIGS. 7A and 7B further illustrate various geometries associated with the FeFETs 130'. For example, the bottom electrode 132' has a thickness t1 and a width w1 at its bottom surface; the FE feature 134' has a thickness t2 and a width w2 at its bottom surface; the top electrode 136' has a thickness t3 and a width w3 at its bottom surface and a width w4 at its top surface. The thicknesses t1, t2, and t3 are measured along the "z" direction. The widths w1, w2, w3, and w4 are measured along the "x" direction. In various embodiments, t1 may range from about 0.5 nm to about 30 nm and t3 may range from about 0.5 nm to about 30 nm. In some embodiments, t2 may range from about 0.5 nm to about 50 nm. If t2 is too thick (e.g., greater than 50 nm), the voltage drop in the FeFET would be high, leading to high power consumption. If t2 is too thin (e.g., thinner than 0.5 nm), the voltage drop in the FeFET would be too low and the layer 134' would likely lose its ferroelectric property. Further, in embodiments, w1 may range from about 1 nm to about 40 nm; w2 may range from about 1 nm to about 37 nm; w3 may range from about 1 nm to about 34 nm; and w4 may range from about 1 nm to about 31 nm. If the widths w1 through w4 are too small (e.g., less than 1 nm), the operating variation among the FeFETs would be high. On the other hand, if the widths w1 through w4 are too large (e.g., greater than the values stated above), device scaling might be hindered. In an embodiment, the FeFET 130' has a generally trapezoidal shape in the "x-z" and "y-z" planes (i.e., the top electrode 136' is narrower than the FE feature 134' which is narrower than the bottom electrode 132' or in other words w4<w3<w2<w1). Further, FIG. 7A illustrates that the dielectric liner 138 has a thickness t4 (measured along the "x" direction or "y" direction), which may range from about 0.5 nm to about 35 nm in various embodiments. In some embodiments, if the thickness t4 is too small (e.g., less than 0.5 nm), then it may lose the insulation property over time, leading to reliability issues. On the other hand, if the thickness t4 is too large (e.g., greater than 035 nm), device scaling might be hindered. Still further, FIGS. 7A and 7B illustrate that the side surface of the dielectric liner 138 and the top surface of the dielectric layer 114 may form an angle θ1 in the "x-z" plane and an angle θ2 in the "y-z" plane; and the side surfaces of the conductive feature 142 and the dielectric liner 138 may form an angle θ3 in the "y-z" plane. In various embodiments, the angle θ1 may range from about 91 degrees to about 150 degrees, the angle θ2 may range from about 91 degrees to about 150 degrees, and the angle θ3 may range from about 45 degrees to about 89 degrees. In various embodiments, if the angles θ1 and 02 are too large (e.g., greater than 150 degrees), the bottom electrode 132' (or the FE feature 134') would be very wide and spacing among nearby FeFETs 130' would be narrow. The narrow spacing might lead to reliability issues over time. Similarly, if the angle θ3 is too small (e.g., smaller than 45 degrees), the conductive features 142 among nearby FeFETs 130' would be too close to each other, leading to reliability issues over time.

At operation 24, the method 10 (FIG. 1A) performs further fabrications to the device 100. For example, the operation 24 may deposit one or more ILD layers over the dielectric layer 140 and the conductive features 142, and form metal lines and metal vias in the one or more ILD layers. The one or more ILD layers, the metal lines, and the metal vias may be part of a multi-layer interconnect layer. Particularly, the metal lines and metal vias connect the conductive features 142 to other conductive features such as gate vias, S/D contact vias, or package I/O pads or package pins, thereby integrating the FeFETs 130' with MOSFETs in the device 100.

FIG. 8A through FIG. 20 illustrate various embodiments (or variants) of the device 100. Most features in these embodiments are the same as those discussed with reference to FIGS. 2A through 7B, with same reference numerals indicating the same or like features. FIG. 8A through FIG. 20 are briefly described below.

Figure 8A:
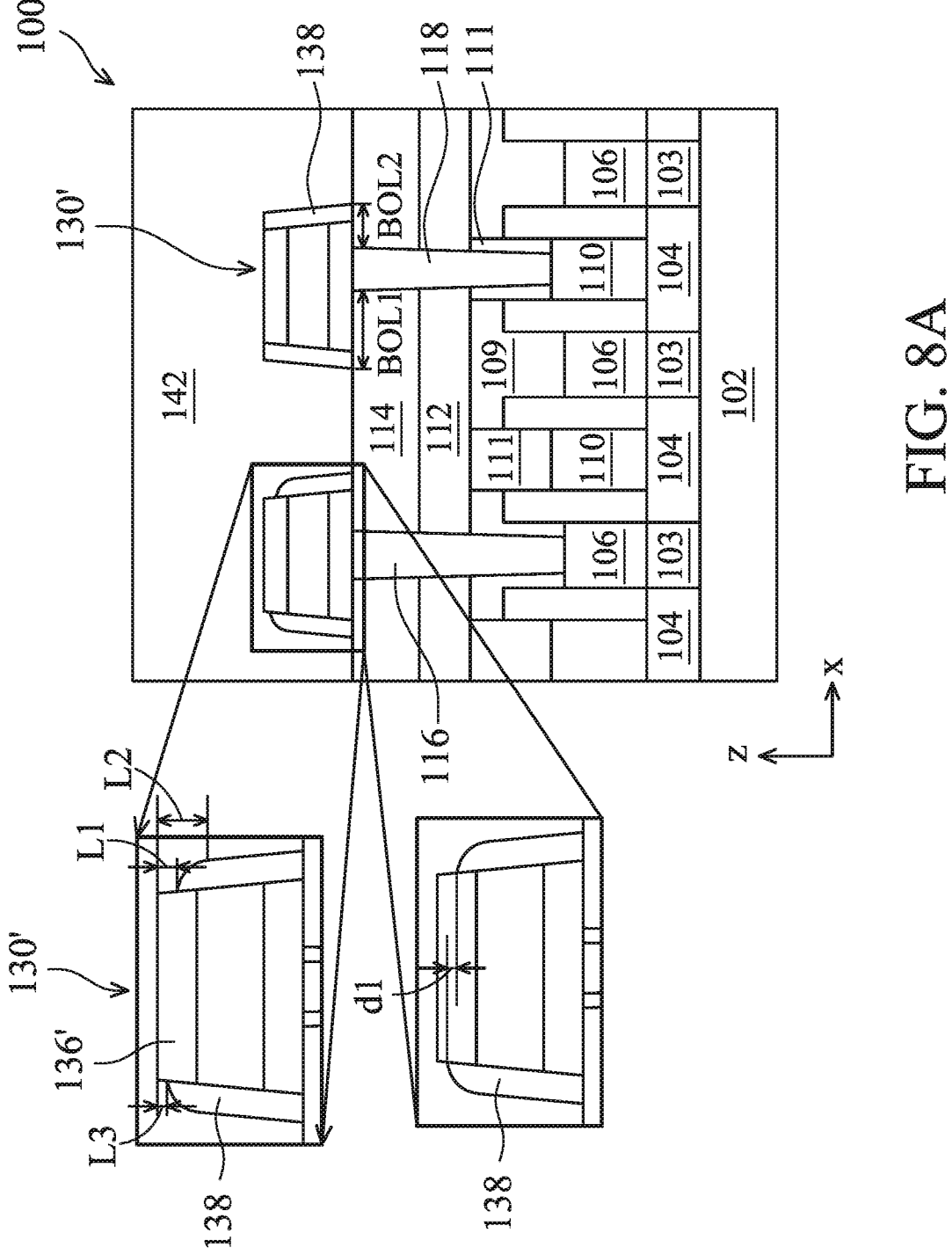

FIG. 8A illustrates an embodiment of the device 100 where the dielectric liner 138 is recessed (for example, during the anisotropic etching process that forms the dielectric liner 138) to a level below the top surface of the top electrode 136'. The top surface of the dielectric liner 138 may be below the top surface of the top electrode 136' by a distance L1 that is about 0 nm to about 30 nm along the "z" direction in various embodiments. Further, the dielectric liner 138 has rounded top corners in this embodiment. The length L2 from the bottom point of the rounded corner of the dielectric liner 138 to the top surface of the top electrode 136' is about 0 nm to about 30 nm along the "z" direction in various embodiments. The top electrode 136' may also have rounded top corners in this embodiment. The length L3 from the bottom point of the rounded corner of the top electrode 136' to the top surface of the top electrode 136' is about 0 nm to about 30 nm along the "z" direction in various embodiments. In various embodiments, if L1, L2, and L3 are too large (e.g., any of them being greater than 30 nm), the ferroelectric property of the FeFET 130' might be interrupted by the conductive feature 142 or the FeFET 130' might not operate properly. Further, the dielectric liner 138 may have a height difference dl between its portion on the left side and its portion on the right side of the FeFET 130' in the "x-z" plane and/or the "y-z" plane. The difference dl is in a range about 0 nm to about 15 nm in various embodiments. FIG. 8A further illustrates an embodiment of the device 100 where the FeFET 130' are landed on the gate vias 116 and/or S/D contact vias 118 with some offset (referred to as bottom offset) from center due to process overlay shift. For example, the bottom offset (which is the difference tween BOL1 and BOL2 in FIG. 8A) may be in a range about −15 nm to about 15 nm in various embodiments.

Figure 8B:
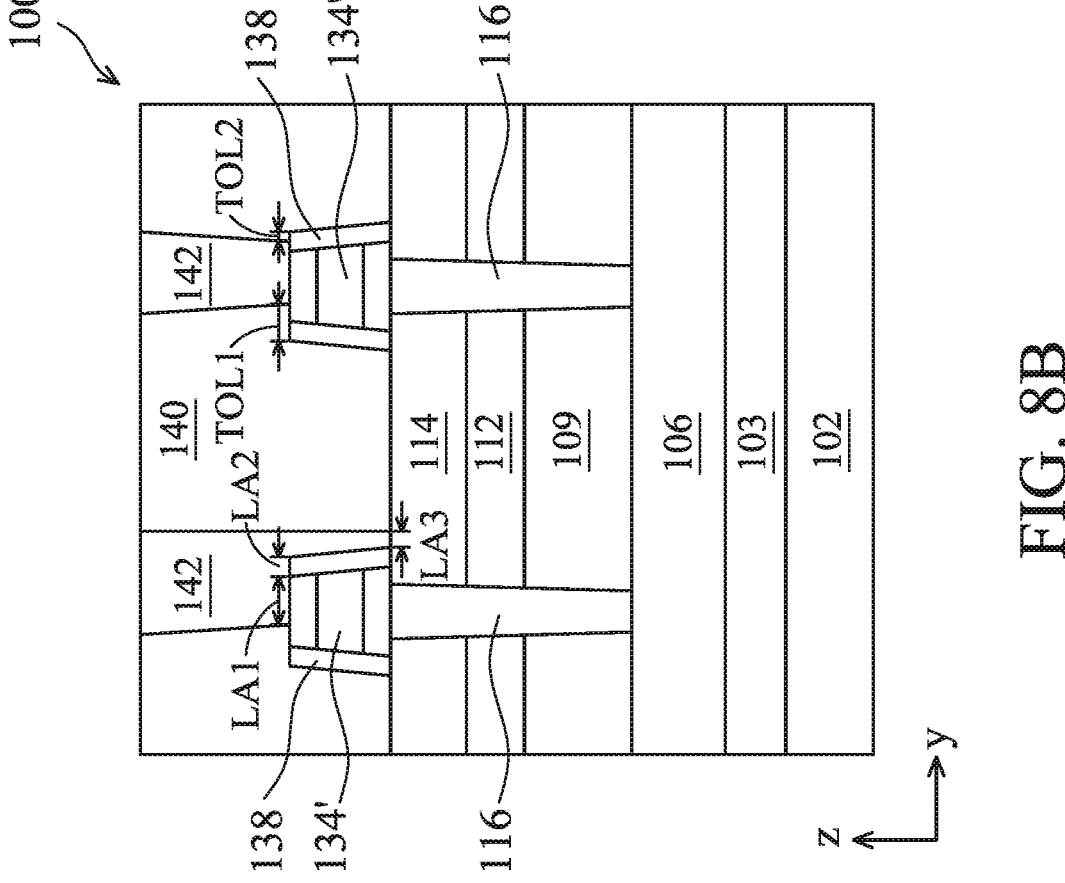

FIG. 8B illustrates an embodiment of the device 100 where some conductive features 142 are landed on the FeFET 130' with some overlay shift. For example, the overlay shift from the left side of the FeFET 130', TOL1, may be in a range about 0 nm to about 15 nm in various embodiments; and the overlay shift from the right side of the FeFET 130', TOL2, may be in a range about 0 nm to about 15 nm in various embodiments. Further, some conductive features 142 may be partially landed on the FeFET 130' and partially landed on the dielectric layer 114. In various embodiments, the conductive features 142 may contact the FeFET 130' for a length LA1 in a range about 0 nm to about nm and may contact the dielectric liner 138 for a length LA2 in a range about 0 nm to about 35 nm. In some embodiments, when the overlay shift is significant, the conductive feature 142 may contact the dielectric layer 114 for a length LA3 in a range about 0 nm to about 10 nm. In various embodiments, if the length LA3 is too large (e.g., greater than nm), there might be a large portion of the conductive feature 142 on the side of the FeFET 130', which would interfere with the ferroelectric property of the FeFET 130'. The lengths LA1, LA2, and LA3 are measured in the "y-z" plane and along the "y" direction.

Figures 9A, 9B:
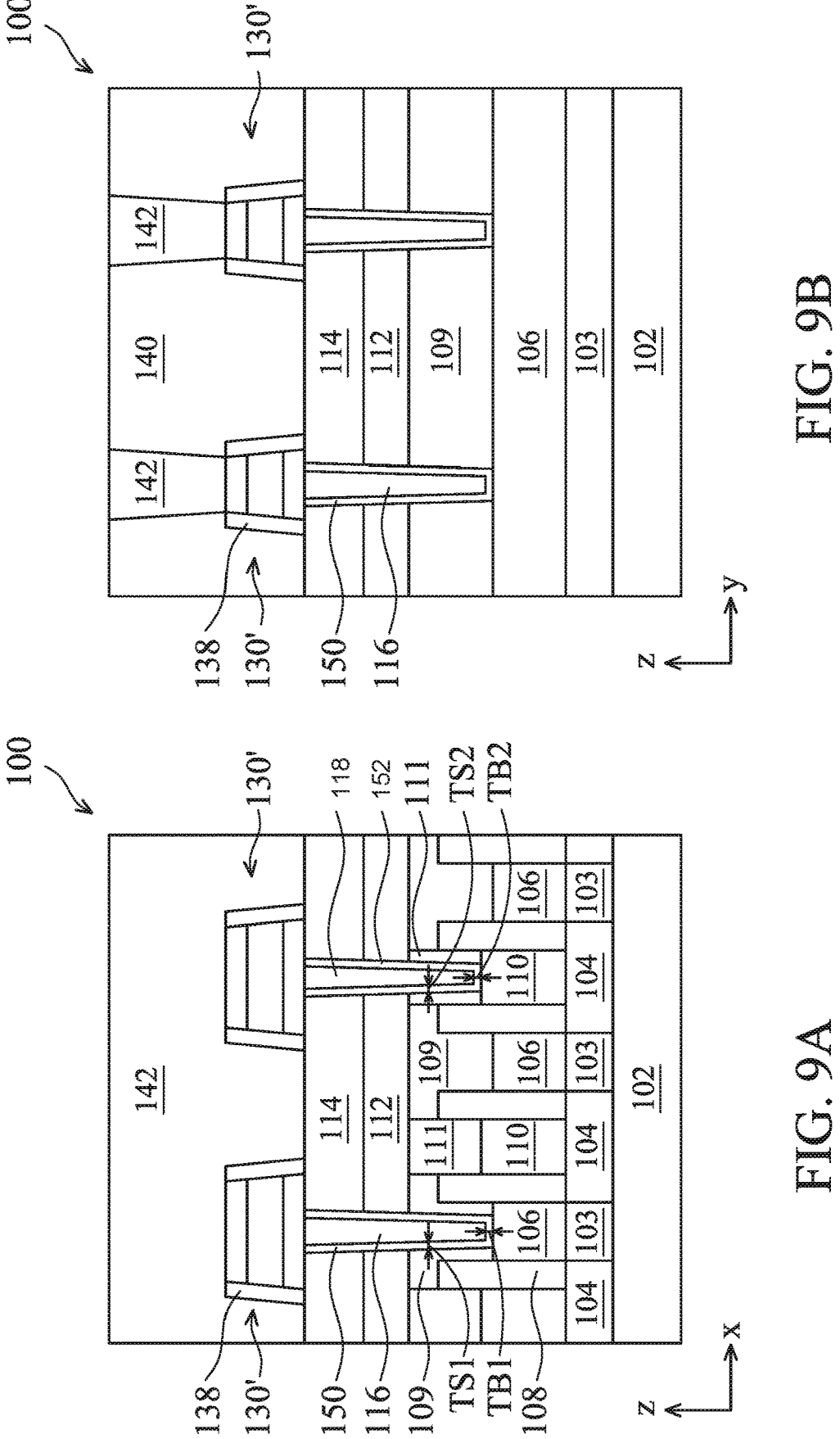

FIGS. 9A and 9B illustrate an embodiment of the device 100 which includes a glue layer (or adhesion layer) 150 on outer surfaces of the gate vias 116 and a glue layer (or adhesion layer) 152 on outer surfaces of the S/D contact vias 118. In various embodiments, the glue layers 150 and 152 may include Co, W, Ru, Al, Mo, Ti, TiN, TiSi, CoSi, NiSi, TaN, Ni, TiSiN, or other suitable materials. Further, the glue layers 150 and 152 may include the same material or different materials and may be formed by the same process or different processes in various embodiments. The glue layer 150 may have a sidewall thickness TS1 (along the "x" or "y" direction) and a bottom thickness TB1 (along the "z" direction). TS1 may range from about 0.1 nm to about 3 nm, and TB1 may range from about 0.1 nm to about 3 nm in various embodiments. The glue layer 152 may have a sidewall thickness TS2 (along the "x" or "y" direction) and a bottom thickness TB2 (along the "z" direction). TS2 may range from about 0.1 nm to about 3 nm, and TB2 may range from about 0.1 nm to about 3 nm in various embodiments. Having the glue layers 150 and 152 may further enhance the reliability of the gate vias 116 and the S/D contact vias 118. In various embodiments, if the glue layers 150 and 152 are too thick (e.g., any of TS1, TB1, TS2, and TB2 being greater than 3 nm), the resistance of the glue layer might be large, which leads to worse device performance. On the other hand, if the glue layers 150 and 152 are too thin (e.g., any of TS1, TB1, TS2, and TB2 being less than 0.1 nm), the vias 116 and 118 may suffer from inadvertent pull-up in subsequent processes due to insufficient adhesion with surround structures.

Figures 10A, 10B:
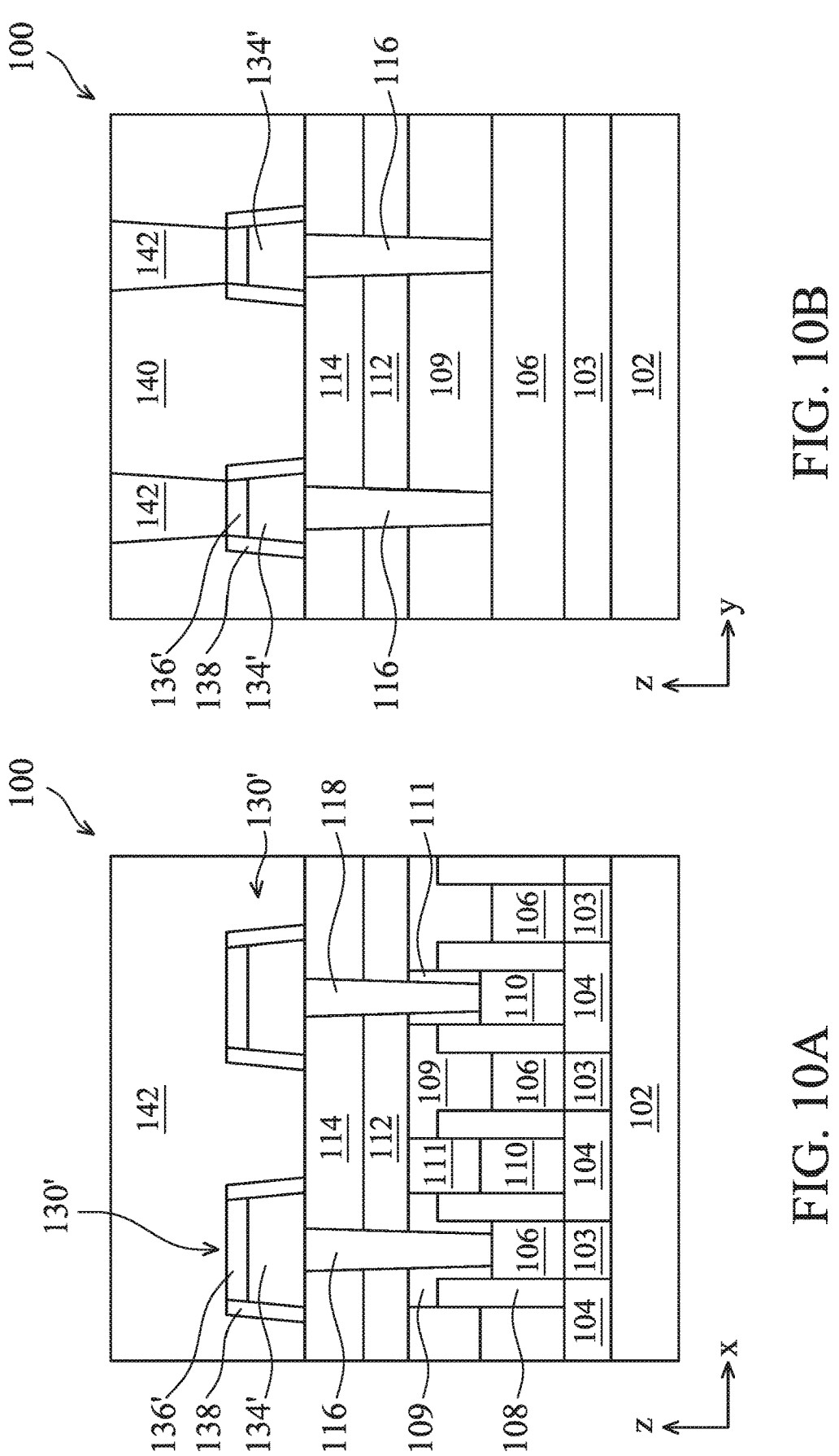

FIGS. 10A and 10B illustrate an embodiment of the device 100 where the bottom electrode 132' is omitted in the FeFETs 130'. As illustrated, the FE features 134' directly contact the gate vias 116 and the S/D contact vias 118. Omitting the bottom electrode 132' further simplifies the manufacturing process and reduces the total thickness of the device 100.

Figures 11A, 11B:
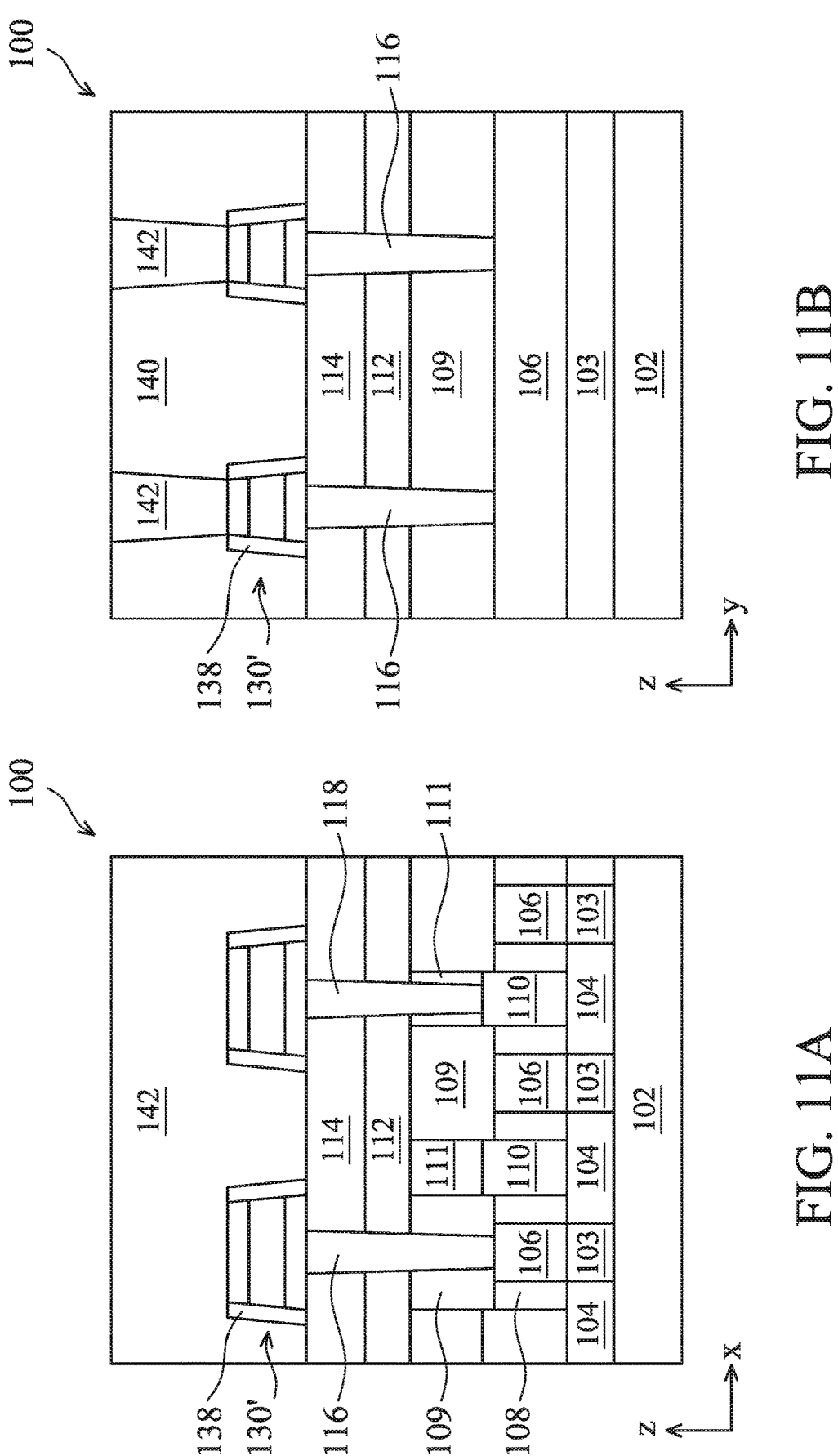

FIGS. 11A and 11B illustrate an embodiment of the device 100 where the gate spacers 108 and the gate stacks 106 have substantially co-planar top surfaces and the dielectric cap 109 is disposed above the top surfaces of the gate spacers 108 and the gate stacks 106, and not disposed laterally between two adjacent gate spacers 108.

Figures 12A, 12B:
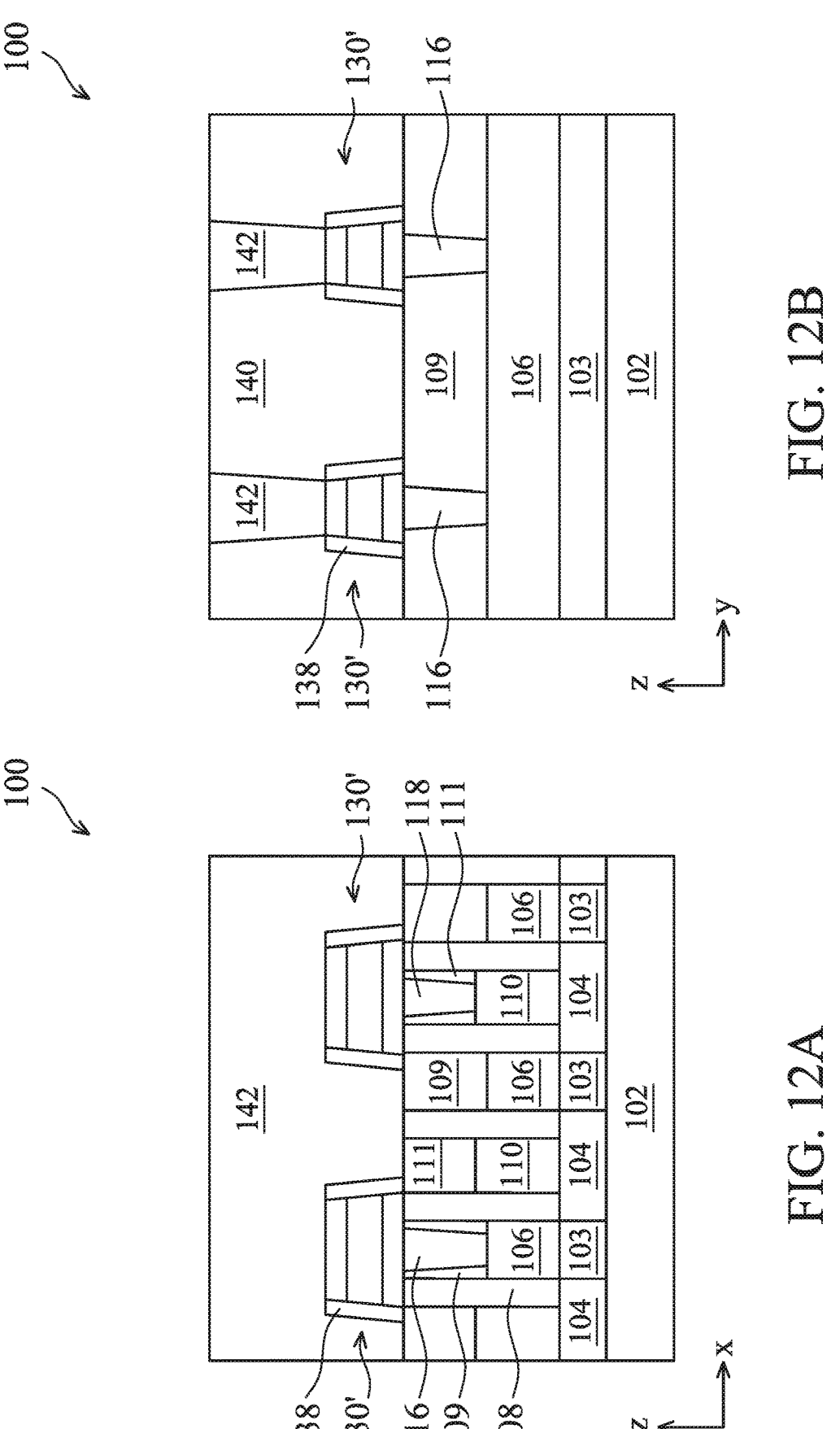

FIGS. 12A and 12B illustrate an embodiment of the device 100 where the dielectric layers 112 and 114 are omitted in the device 100. The dielectric caps 109 and 111 are disposed laterally between adjacent gate spacers 108. The vias 116 and 118 are formed in the dielectric caps 109 and 111, respectively. The dielectric caps 109 and 111, the gate spacers 108, and the vias 116 and 118 have substantially co-planar top surfaces. The FeFETs 130' are disposed directly on the top surfaces of the gate spacers 108, the dielectric caps 109 and 111, and the vias 116 and 118. Though not shown in FIGS. 12A and 12B, the bottom electrode 132's may be omitted in the FeFETs 130' in some embodiments. Omitting the dielectric layers 112 and 114 further simplifies the manufacturing process and reduces the total thickness of the device 100.

Figures 13A, 13B:
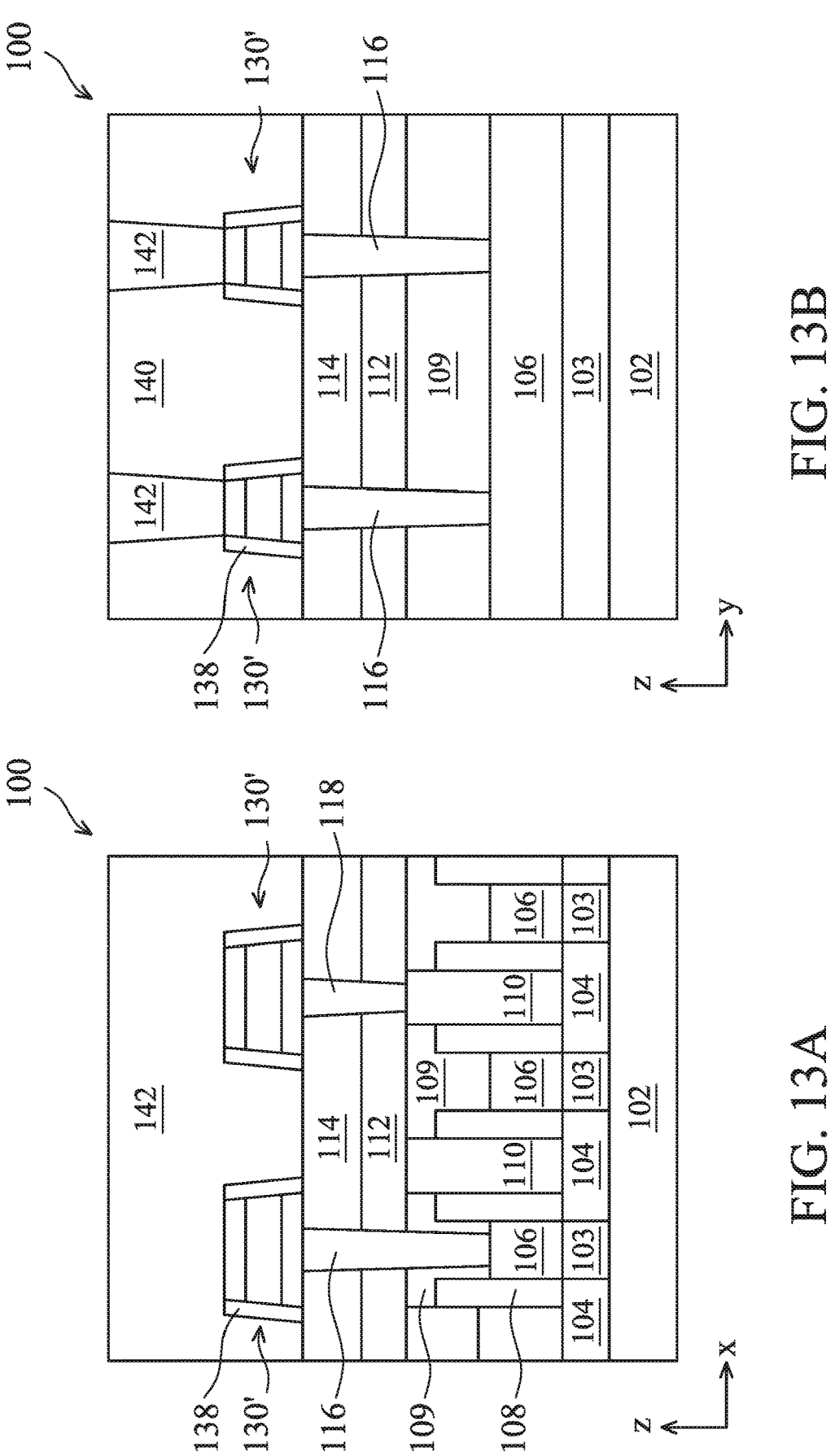

FIGS. 13A and 13B illustrate an embodiment of the device 100 where the dielectric cap 111 is omitted in the device 100. As illustrated, the S/D contacts 110 and the dielectric cap 109 have substantially co-planar top surfaces, and the dielectric layer 112 is disposed on the top surfaces of the S/D contacts 110 and the dielectric cap 109. The S/D contact vias 118 penetrate the dielectric layers 114 and 112 to electrically contact the S/D contacts 110. Omitting the dielectric cap 111 shortens the connection between the FeFET 130' and the S/D contacts 110, enabling faster operations of the FeFET 130'.

Figures 14A, 14B:
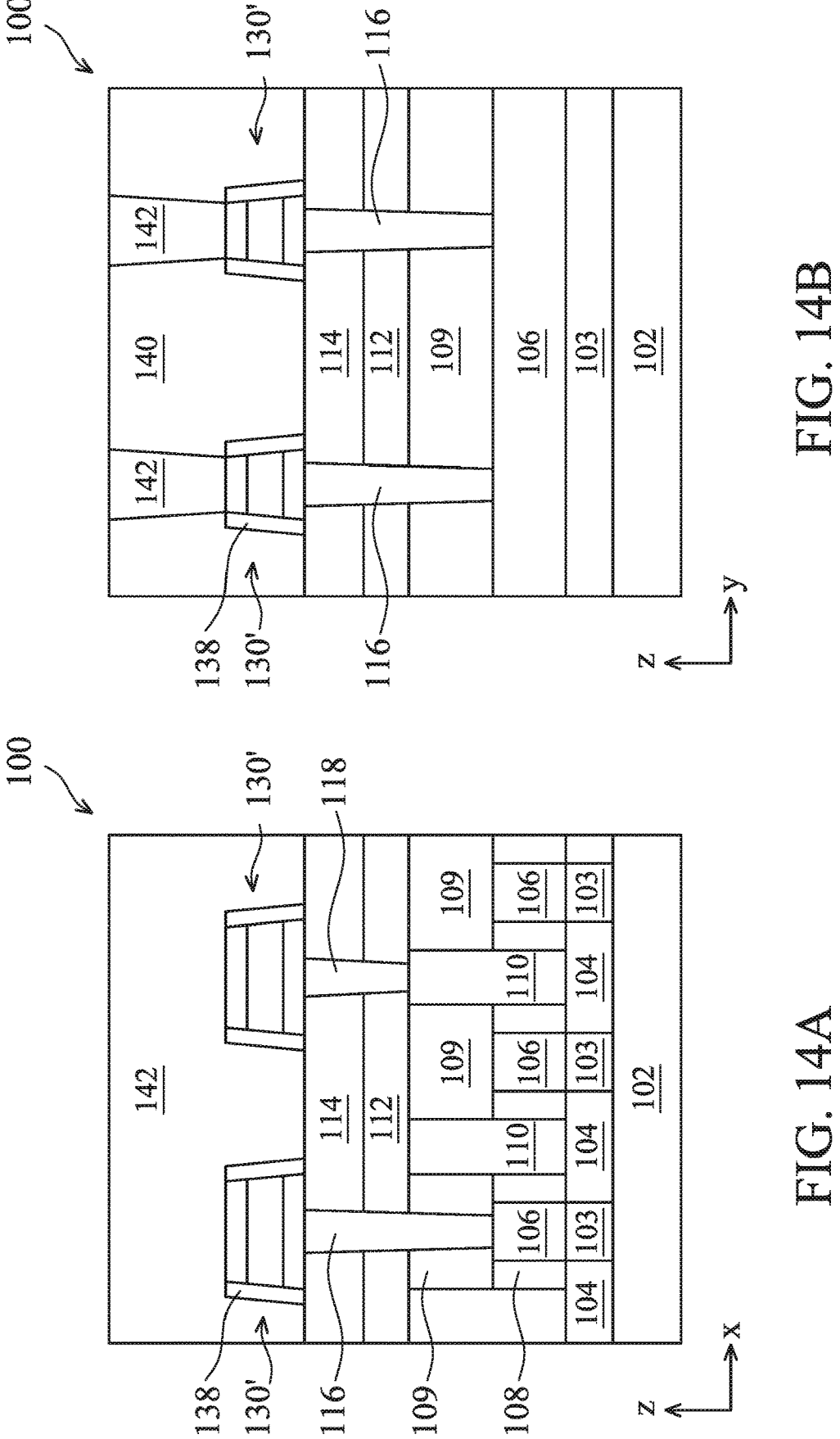

FIGS. 14A and 14B illustrate an embodiment of the device 100 similar to that shown in FIGS. 13A and 13B, i.e., the dielectric cap 111 is omitted in the device 100. Further, the gate spacers 108 and the gate stacks 106 have substantially co-planar top surfaces and the dielectric cap 109 is disposed above the top surfaces of the gate spacers 108 and the gate stacks 106, and not disposed laterally between two adjacent gate spacers 108. The dielectric cap 109 and the S/D contacts 110 have substantially co-planar top surfaces, and the dielectric layer 112 is disposed on the top surfaces of the S/D contacts 110 and the dielectric cap 109.

Figures 15A, 15B:
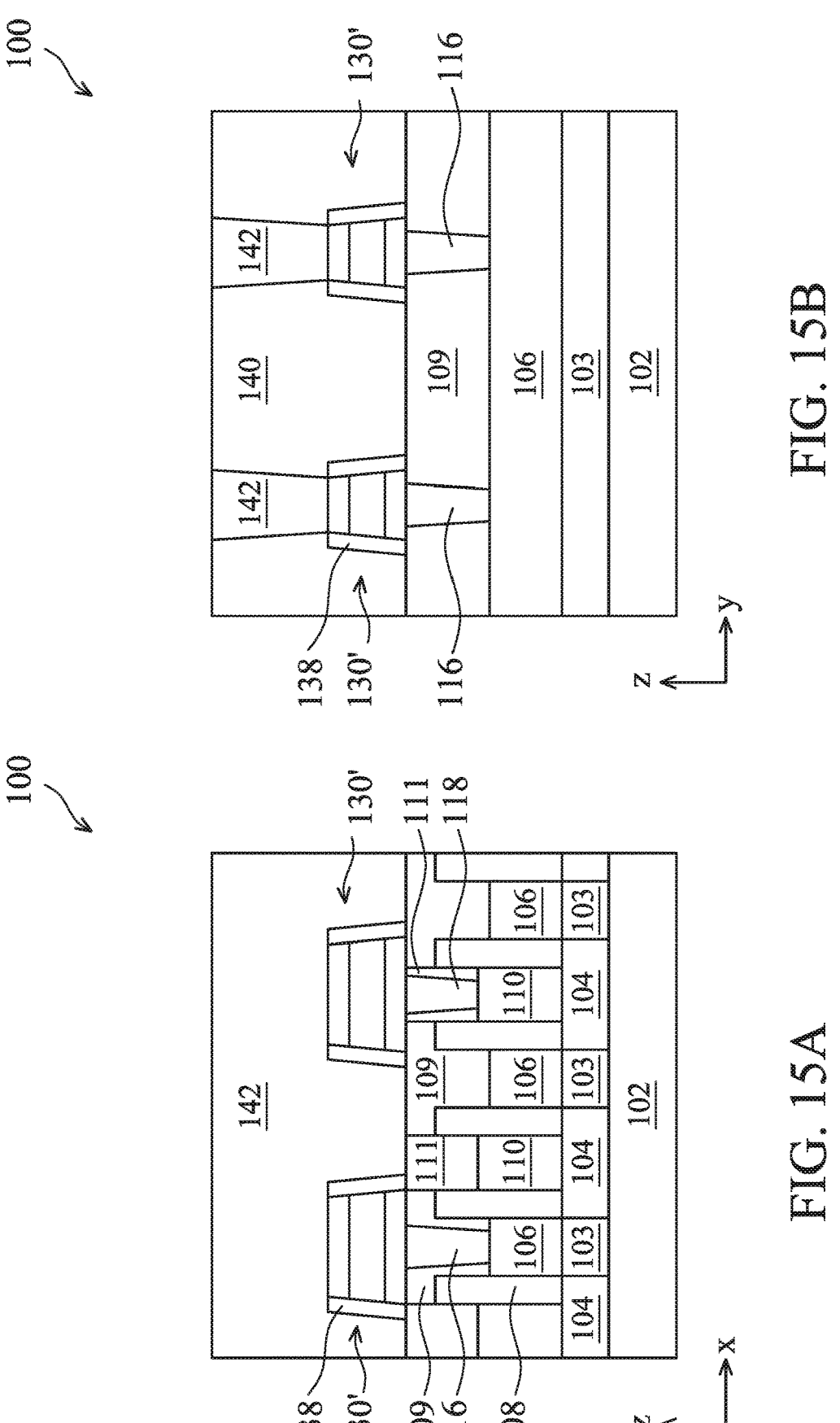

FIGS. 15A and 15B illustrate an embodiment of the device 100 where the dielectric layers 112 and 114 are omitted in the device 100, similar to the embodiment shown in FIGS. 12A and 12B. A difference between the two embodiments lies in the configuration of the dielectric cap 109. In the embodiment shown in FIGS. 12A and 12B, the dielectric cap 109 is disposed only laterally between the adjacent gate spacers 108. In the embodiment shown in FIGS. 15A and 15B, the dielectric cap 109 is disposed not only laterally between the adjacent gate spacers 108, but also above the gate spacers 108. The dielectric caps 109 and 111 have substantially co-planar top surfaces, and the FeFETs 130' are disposed directly on the top surfaces of the dielectric caps 109 and 111.

Figures 16A, 16B:
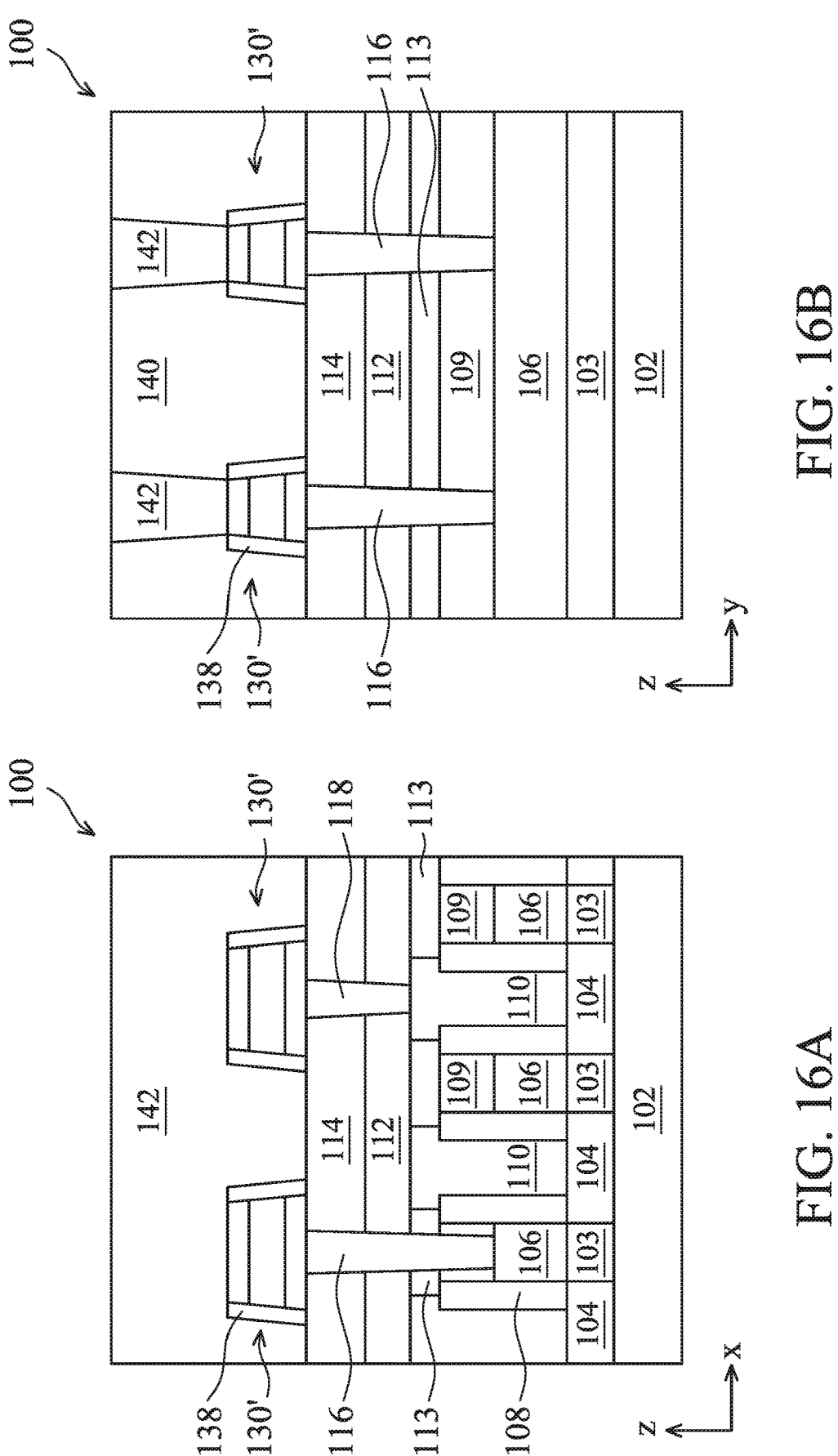

FIGS. 16A and 16B illustrate an embodiment of the device 100 where the device 100 further includes a dielectric layer 113 between the dielectric cap 109 and the dielectric layer 112. The dielectric cap 109 is disposed only laterally between the adjacent gate spacers 108. The dielectric layer 113 and the S/D contacts 110 have substantially co-planar top surfaces, and the dielectric layer 112 is disposed on the top surfaces of the dielectric layer 113 and the S/D contacts 110. In various embodiments, the dielectric layer 113 may include a material such as $La_2O_3$, $Al_2O_3$, SiOCN, SiOC, SiCN, $SiO_2$, SiC, ZnO, $TaO_2$, $ZrO_2$, $HfO_2$, $Si_3N_4$, SiON, or other suitable material(s).

Figures 17A, 17B:
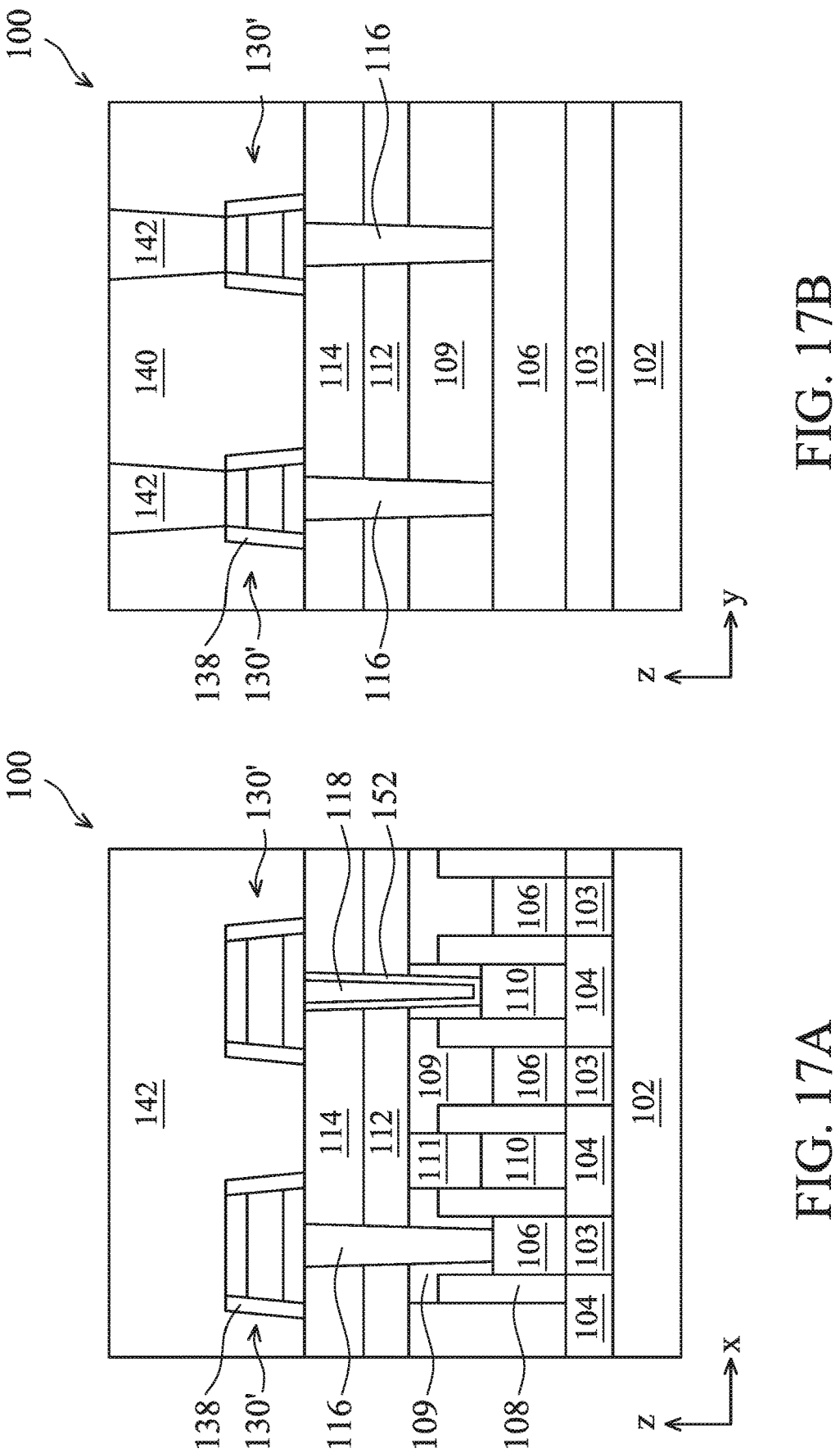

FIGS. 17A and 17B illustrate an embodiment of the device 100 where the device 100 includes the glue layer 152 on outer surfaces of the S/D contact vias 118, but no glue layer on outer surfaces of the gate vias 116.

Figures 18A, 18B:
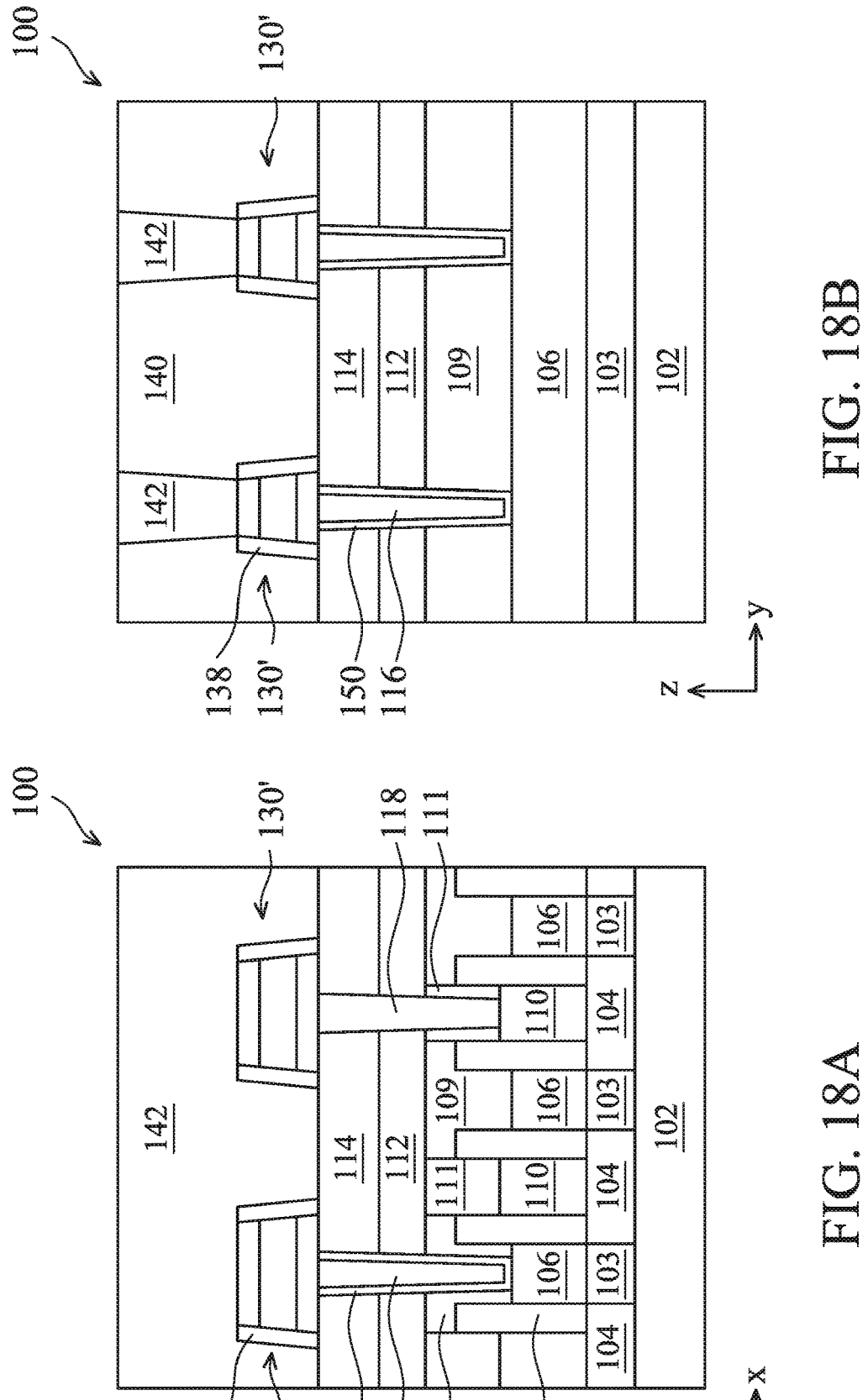

FIGS. 18A and 18B illustrate an embodiment of the device 100 where the device 100 includes the glue layer 150 on outer surfaces of the gate vias 116, but no glue layer on outer surfaces of the S/D contact vias 118.

Figure 19:
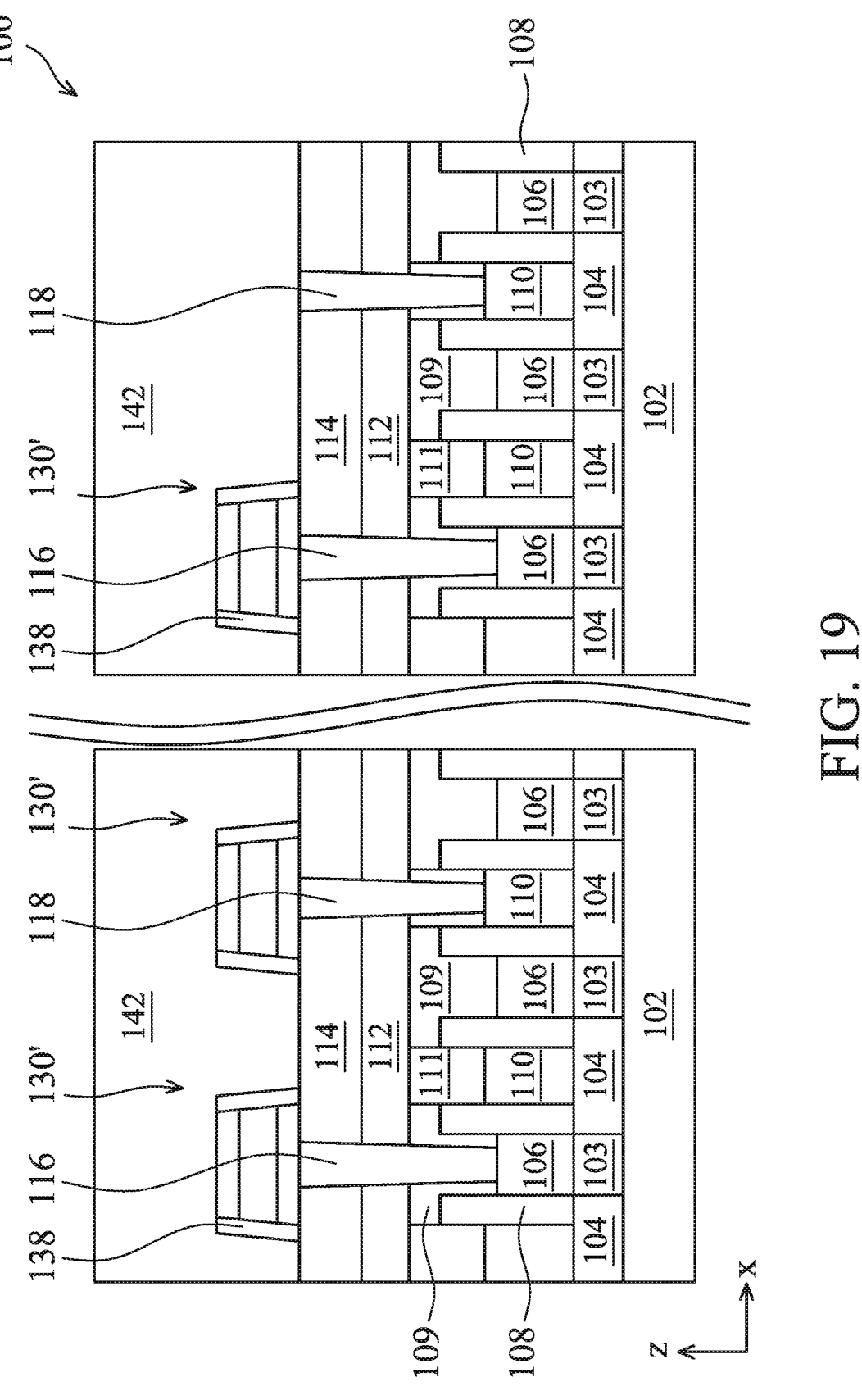

FIG. 19 illustrates an embodiment of the device 100 where some of the S/D contact vias 118 are directly connected to FeFETs 130' (FIG. 19, left) and some other S/D contact vias 118 are not directly connected to FeFETs 130' (FIG. 19, right). In various embodiments, the S/D contact vias 118 on the right side of FIG. 19 may connect to the top electrode 136' of an FeFET 130' through the conductive feature 142 (as shown), or not connected to the conductive feature 142 and any FeFET 130'.

Figure 20:
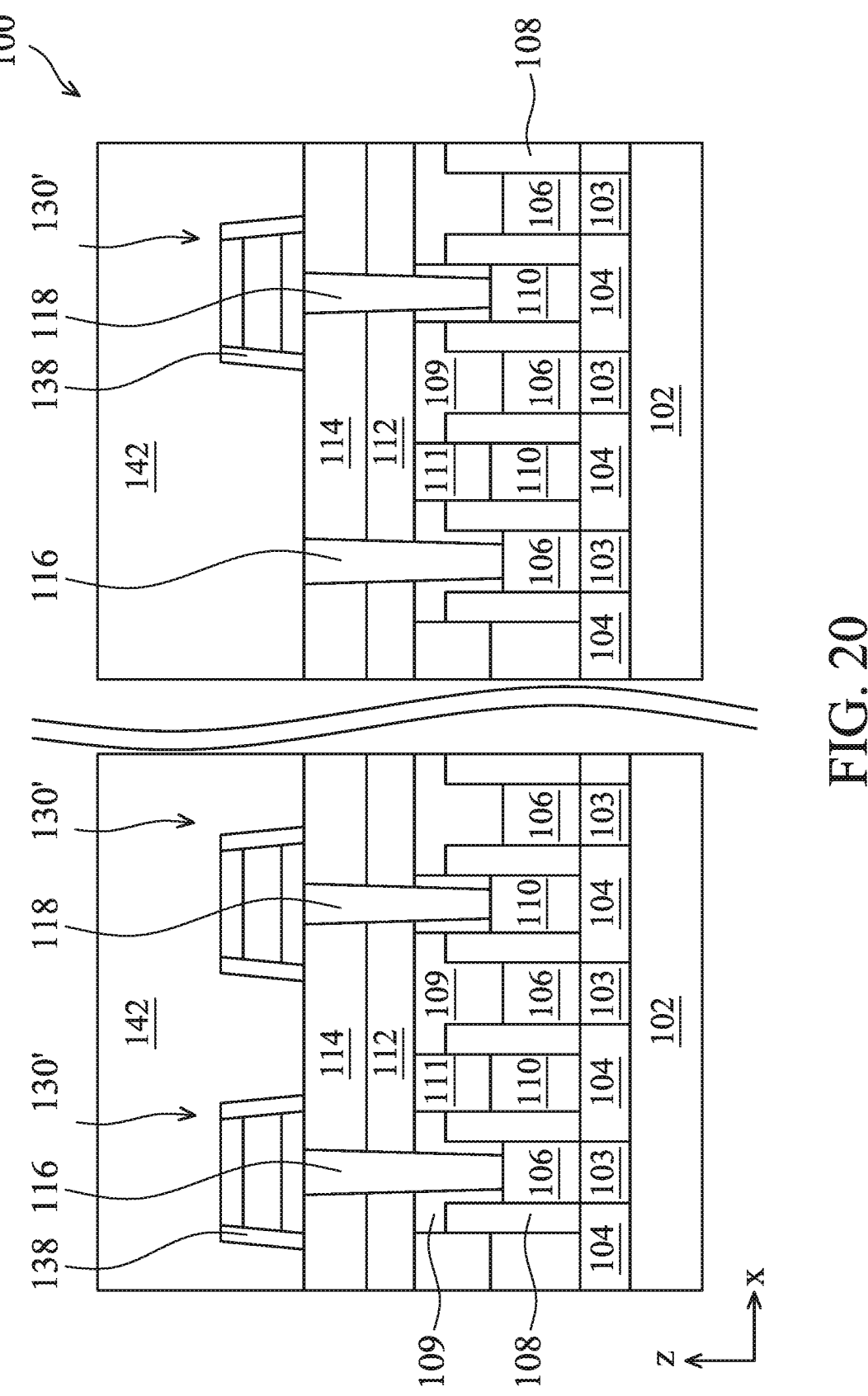

FIG. 20 illustrates an embodiment of the device 100 where some of the gate vias 116 are directly connected to FeFETs 130' (FIG. 20, left) and some other gate vias 116 are not directly connected to FeFETs 130' (FIG. 20, right). In various embodiments, the gate vias 116 on the right side of FIG. 20 may connect to the top electrode 136' of an FeFET 130' through the conductive feature 142 (as shown), or not connected to the conductive feature 142 and any FeFET 130'.

It is noted that features in the above embodiments of the device 100 may be combined to produce variants (or other embodiments) of the device 100.

Although not intended to be limiting, embodiments of the present disclosure provide one or more of the following advantages. First, the footprint of FeFETs could be made much smaller, which enables better operating margin. Second, routing between the FeFETs and the electrodes (gate, source, and drain) of the MOSFETs are shortened and simplified. Third, since the FeFETs are formed in the middle-end-of-line (MEOL) process and before BEOL process, thermal budget is relaxed and higher temperature or longer process time can be allowed.

In one example aspect, the present disclosure is directed to a method that includes providing a structure having a substrate, gate stacks and source/drain (S/D) features over the substrate, S/D contacts over the S/D features, one or more dielectric layers over the gate stacks and the S/D contacts, and a via structure penetrating the one or more dielectric layers and electrically connecting to one of the gate stacks and the S/D contacts. The method further includes forming a ferroelectric (FE) stack over the structure, wherein the FE stack includes an FE layer and a top electrode layer over the FE layer, wherein the FE stack directly contacts the via structure; and patterning the FE stack, resulting in a patterned FE stack including a patterned FE feature and a patterned top electrode over the patterned FE feature.

In an embodiment of the method, the FE layer includes one of PZT ($Pb(Zr_xTi_{1-x})O_3$), SBT ($SrBi_2Ta_2O_9$), BLT (($Bi$, $La)_4Ti_3O_{12}$), BIT ($Bi_4Ti_3O_{12}$), $HfZrO_2$, $HfO_2$, and BFO ($BiFeO_3$). In an embodiment, the top electrode layer includes one of Ru, Pt, Ta, TaN, Ti, $TiO_2$, TiN, W, Ir, $IrO_2$, $SrRuO_3$, and $LaNiO_3$.

In an embodiment, the method further includes forming a first dielectric layer on sidewalls of the patterned FE stack. In a further embodiment, the first dielectric layer includes one of $La_2O_3$, $Al_2O_3$, SiOCN, SiOC, SiCN, $SiO_2$, SiC, ZnO, ZrN, ZrAlO, $Ta_2O_5$, $ZrO_2$, $HfO_2$, $Si_3N_4$, $Y_2O_3$, AlON, TaCN, and SiON.

In another embodiment, the method further includes depositing a first dielectric layer over the patterned FE stack and forming a conductive structure that penetrates the first dielectric layer and directly contacts the patterned top electrode.

In an embodiment of the method, the FE stack further includes a bottom electrode layer under the FE layer and the patterned FE stack further includes a patterned bottom electrode under the patterned FE feature. In an embodiment of the method, the via structure includes one of Co, W, Ru, Al, Mo, Ti, TiN, TiSi, CoSi, NiSi, TaN, Ni, and TiSiN.

In another example aspect, the present disclosure is directed to a method that includes providing a structure having a substrate, gate stacks and source/drain (S/D) features over the substrate, S/D contacts over the S/D features, one or more dielectric layers over the gate stacks and the S/D contacts, and a via structure penetrating the one or more dielectric layers and electrically connecting to one of the gate stacks and the S/D contacts. The method further includes forming a ferroelectric (FE) stack over the structure, wherein the FE stack includes a bottom electrode layer, an FE layer over the bottom electrode layer, and a top electrode layer over the FE layer, wherein the FE stack directly contacts the via structure; patterning the FE stack, resulting in a patterned FE stack including a patterned bottom electrode, a patterned FE feature over the patterned bottom electrode, and a patterned top electrode over the patterned FE feature; and forming a dielectric liner surrounding sidewalls of the patterned FE stack.

In an embodiment of the method, the FE layer includes one of PZT ($Pb(Zr_xTi_{1-x})O_3$), SBT ($SrBi_2Ta_2O_9$), BLT (($Bi$, $La)_4Ti_3O_{12}$), BIT ($Bi_4Ti_3O_{12}$), $HfZrO_2$, $HfO_2$, and BFO ($BiFeO_3$).

In an embodiment, the method further includes forming a first dielectric layer embedding the patterned FE stack and forming a conductive structure that penetrates the first dielectric layer and directly contacts the patterned top electrode.

In some embodiments, the one or more dielectric layers include a dielectric cap that is directly on the one of the gate stacks and the S/D contacts. In some embodiments, the one or more dielectric layers include a contact etch stop layer and an inter-level dielectric layer over the contact etch stop layer. In some embodiments, the one or more dielectric layers include a dielectric cap that is directly on the one of the gate stacks and the S/D contacts, a contact etch stop layer over the dielectric cap, and an inter-level dielectric layer over the contact etch stop layer.

In some embodiments, the patterning of the FE stack includes forming an etch mask using photolithography and etching the top electrode layer, the FE layer, and the bottom electrode layer through openings in the etch mask.

In yet another example aspect, the present disclosure is directed to a device that includes a substrate; gate stacks and source/drain (S/D) features over the substrate; S/D contacts over the S/D features; one or more dielectric layers over the gate stacks and the S/D contacts; a via structure penetrating the one or more dielectric layers and electrically contacting one of the gate stacks and the S/D contacts; and a ferroelectric (FE) stack over the via structure and directly contacting the via structure, wherein the FE stack includes an FE feature and a top electrode over the FE feature.

In some embodiments of the device, the FE stack further includes a bottom electrode under the FE feature. In some embodiments, the FE feature directly contacts the via structure. In some embodiments, the device further includes a dielectric liner surrounding sidewalls of the FE stack. In some embodiments, the device further includes a first dielectric layer embedding the FE stack and a conductive feature penetrating the first dielectric layer and directly contacting the top electrode.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
gate stacks and source/drain (S/D) features over the substrate;
S/D contacts over the S/D features;
S/D dielectric caps over the S/D contacts;

an S/D via penetrating one of the S/D dielectric caps and electrically contacting one of the S/D contacts, wherein the S/D via is above the one of the S/D contacts; and
a ferroelectric (FE) stack over the S/D via and directly contacting the S/D via, wherein the FE stack includes an FE feature and a top electrode over the FE feature.

2. The device of claim 1, further comprising:
a dielectric layer over the FE stack; and
conductive features embedded in the dielectric layer and electrically connected to the FE stack,
wherein the S/D via includes a first metal, the conductive features include a second metal, and the first metal has a higher melting point than the second metal.

3. The device of claim 2, wherein the conductive features include copper, and the S/D via is free of copper.

4. The device of claim 1, further comprising:
one or more dielectric layers between the FE stack and the S/D dielectric caps, and the S/D via penetrates through the one or more dielectric layers to electrically connect the FE stack to the one of the S/D contacts.

5. The device of claim 1, further comprising:
a via glue layer between the S/D via and the one of the S/D dielectric caps.

6. The device of claim 1, wherein the FE feature directly contacts the S/D via.

7. The device of claim 1, wherein the FE stack further includes a bottom electrode under the FE feature, and the bottom electrode directly contacts the S/D via.

8. The device of claim 1, further comprising dielectric liners on sidewalls of the FE stack.

9. A device, comprising:
a substrate;
gate stacks and source/drain (S/D) features over the substrate;
S/D contacts over the S/D features;
an S/D via landing on one of the S/D contacts, wherein the S/D via is above the one of the S/D contacts;
a ferroelectric (FE) stack landing on the S/D via, wherein the FE stack includes an FE feature and a top electrode over the FE feature; and
an S/D metal line over and electrically connected to the FE stack.

10. The device of claim 9,
wherein the S/D via includes Co, W, Ru, Mo, or combinations thereof,
wherein the S/D metal line includes copper or aluminum.

11. The device of claim 9, further comprising:
a dielectric layer directly over the gate stacks and the S/D contacts, wherein the S/D via penetrates through the dielectric layer to land on the one of the S/D contacts.

12. The device of claim 11, further comprising:
an S/D dielectric cap directly over the S/D features and directly below the dielectric layer, wherein the S/D via penetrates through the S/D dielectric cap to land on the one of the S/D contacts.

13. The device of claim 9, further comprising:
gate dielectric caps directly over the gate stacks;
a gate via penetrating through one of the gate dielectric caps to land on one of the gate stacks, wherein the gate via is above the one of the gate stacks; and
a second FE stack landing on the gate via, wherein the second FE stack includes an FE feature and a top electrode over the FE feature.

14. The device of claim 13, further comprising:
a gate metal line over and electrically connected to the second FE stack, wherein the gate via includes Co, W, Ru, Mo, or combinations thereof, wherein the gate metal line includes copper or aluminum.

15. A device, comprising:

a substrate;

gate stacks and source/drain (S/D) features over the substrate;

a gate via landing on one of the gate stacks, wherein the gate via is above the one of the gate stacks, wherein the gate via penetrates through one or more dielectric layers to land on the one of the gate stacks;

a ferroelectric (FE) stack landing on the gate via, wherein the FE stack includes an FE feature and a top electrode over the FE feature; and a gate metal line over and electrically connected to the FE stack.

16. The device of claim 15, wherein the gate via includes Co, W, Ru, Mo, or combinations thereof, wherein the gate metal line includes copper or aluminum.

17. The device of claim 15, wherein the one or more dielectric layers include a dielectric layer directly above the gate stacks and the S/D features, wherein the gate via penetrates through the dielectric layer to land on the one of the gate stacks.

18. The device of claim 17, further comprising:

a gate dielectric cap directly over the one of the gate stacks and directly below the dielectric layer, wherein the gate via penetrates through the gate dielectric cap to land on the one of the gate stacks.

19. The device of claim 15, further comprising:

S/D contacts over the S/D features;

an S/D via landing on one of the S/D contacts, wherein the S/D via is above the one of the S/D contacts; and a second ferroelectric (FE) stack landing on the S/D via, wherein the second FE stack includes an FE feature and a top electrode over the FE feature.

20. The device of claim 19, further comprising:

an S/D metal line over and electrically connected to the second FE stack, wherein the S/D via includes Co, W, Ru, Mo, or combinations thereof, wherein the S/D metal line includes copper or aluminum.

* * * * *